United States Patent
Ishikawa et al.

(10) Patent No.: US 6,757,525 B1
(45) Date of Patent: Jun. 29, 2004

(54) DISTORTION COMPENSATING APPARATUS

(75) Inventors: Hiroyoshi Ishikawa, Kawasaki (JP); Kazuo Nagatani, Kawasaki (JP); Yasuyuki Oishi, Kawasaki (JP); Tokuro Kubo, Kawasaki (JP); Hajime Hamada, Kawasaki (JP); Nobukazu Fudaba, Kawasaki (JP); Mitsuharu Hamano, Sapporo (JP); Tohru Sasaki, Sapporo (JP); Yuki Kanno, Sapporo (JP); Koichi Hanada, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 10/280,705

(22) Filed: Oct. 25, 2002

(30) Foreign Application Priority Data

Mar. 29, 2002 (JP) ........................................ 2002-095145

(51) Int. Cl.[7] .................................................. H04B 1/04
(52) U.S. Cl. .................... 455/114.3; 455/126; 330/149; 330/151; 375/296
(58) Field of Search ................................ 455/126, 127, 455/501, 63.1, 114.3; 375/296, 346, 345, 295, 297; 330/149, 150, 151; 332/159, 160, 161, 162

(56) References Cited

U.S. PATENT DOCUMENTS

| | | | | |
|---|---|---|---|---|
| 5,126,687 A | * | 6/1992 | Onoda et al. ................ 330/149 |
| 5,448,203 A | * | 9/1995 | Matui et al. ................. 330/149 |
| 5,699,383 A | * | 12/1997 | Ichiyoshi ..................... 375/297 |
| 5,770,971 A | * | 6/1998 | McNicol ....................... 330/52 |
| 5,870,668 A | * | 2/1999 | Takano et al. ............... 455/126 |
| 5,892,397 A | * | 4/1999 | Belcher et al. ............. 330/149 |
| 6,072,364 A | * | 6/2000 | Jeckeln et al. ............. 330/149 |
| 6,081,158 A | * | 6/2000 | Twitchell et al. ........... 330/149 |
| 6,141,390 A | * | 10/2000 | Cova ........................... 375/297 |
| 6,275,685 B1 | * | 8/2001 | Wessel et al. ............... 455/126 |
| 6,522,198 B2 | * | 2/2003 | Ahn ............................. 330/149 |

FOREIGN PATENT DOCUMENTS

JP         9-69733          3/1997

\* cited by examiner

*Primary Examiner*—Charles Appiah
(74) *Attorney, Agent, or Firm*—Katten Muchin Zavis Rosenman

(57) ABSTRACT

In an adaptive predistorter type distortion compensating apparatus for calculating a distortion compensating coefficient by using an adaptive algorithm so as to reduce an error between a reference signal and a feedback signal of a circuit which generates a distortion on the basis of the reference signal, and for compensating the distortion by providing the distortion compensating coefficient to the reference signal, a phase adjustment circuit is provided for determining a phase shift value which reduces a phase difference between a reference signal and a feedback signal, for correcting the phase of the reference signal or the feedback signal by the phase shift value, and for calculating the distortion compensating apparatus after the correction.

14 Claims, 22 Drawing Sheets

2 SUBTRACTOR 4,12,15,16 COMPLEX MULTIPLIER 7,11 OSCILLATOR

14 INVERTER

17 MULTIPLIER

18 ADDER

D.C.C. DISTORTION COMPENSATING COEFFICIENT

2 SUBTRACTOR
4,12,15,16 COMPLEX MULTIPLIER
7,11 OSCILLATOR
14 INVERTER
17 MULTIPLIER
18 ADDER
D.C.C. DISTORTION COMPENSATING COEFFICIENT

| DISTORTION COMPENSATING COEFFICIENT SIGN BIT | | \| IMAGINARY PART \| > THRESHOLD VALUE B | PHASE UPDATE INFORMATION |
|---|---|---|---|
| REAL PART | IMAGINARY PART | | |
| + | + | Yes | + |
| | | No | 0 |
| + | − | Yes | − |
| | | No | 0 |
| − | + | | + |
| − | − | | − |

2 SUBTRACTOR
4,12,15,16 COMPLEX MULTIPLIER
7,11 OSCILLATOR
14 INVERTER
17 MULTIPLIER
18 ADDER
D.C.C. DISTORTION COMPENSATING COEFFICIENT

2 SUBTRACTOR
4,12,15,16 COMPLEX MULTIPLIER
7,11 OSCILLATOR
14 INVERTER
17 MULTIPLIER
18 ADDER
D.C.C. DISTORTION COMPENSATING COEFFICIENT

2 SUBTRACTOR
4,12,15,16 COMPLEX MULTIPLIER
7,11 OSCILLATOR
14 INVERTER
17 MULTIPLIER
18 ADDER
D.C.C. DISTORTION COMPENSATING COEFFICIENT

TRANSMISSION SIGNAL

θ : 0° DIRECTION $$\begin{pmatrix} \text{REAL PART} \geq 0 \\ \text{IMAGINARY PART} \geq 0 \\ \text{REAL PART} - \text{IMAGINARY PART} \geq 0 \end{pmatrix}$$

FEEDBACK SIGNAL S$_F$

PHASE CORRECTION

FIG.17A  FIG.17B
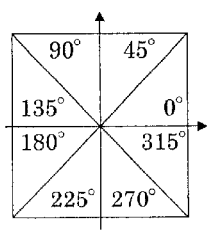  DECODE PHASE DIFFERENCE ⇒  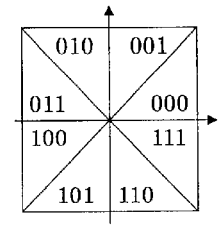
FIG.17C
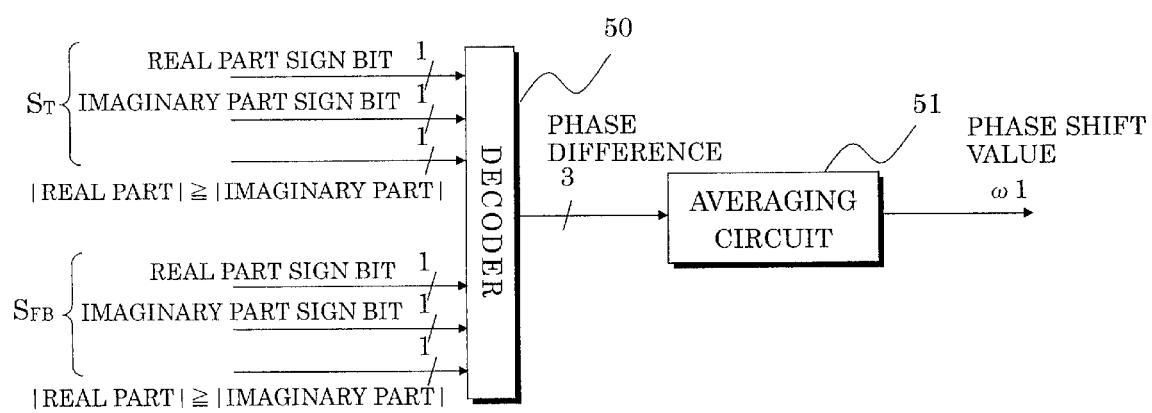

2 SUBTRACTOR
4,12,15,16 COMPLEX MULTIPLIER
7,11 OSCILLATOR
14 INVERTER
17 MULTIPLIER
18 ADDER
D.C.C. DISTORTION COMPENSATING COEFFICIENT $x(t)$ : INPUT SIGNAL
$f(p)$ : FUNCTION OF AMPLIFIER DISTORTION
$h(p)$ : DISTORTION COMPENSATING COEFFICIENT
$y(t)$ : OUTPUT SIGNAL
$\mu$ : STEP SIZE PARAMETER

2 SUBTRACTOR
4,12,15,16,72 COMPLEX MULTIPLIER
7,11 OSCILLATOR
14 INVERTER
17 MULTIPLIER
18,71 ADDER
D.C.C. DISTORTION COMPENSATING COEFFICIENT

PHASE DIFFERENCE 0°

PHASE DIFFERENCE 180°

DISTORTION COMPENSATING APPARATUS

BACKGROUND OF THE INVENTION

1. Field of the Invention

The present invention relates to a distortion compensating apparatus, and in particular to an apparatus for compensating a distortion generated upon amplifying a linear modulation signal at a power amplifier, a low noise amplifier, or the like used for a wireless communication system or the like.

A power amplifier or the like, which amplifies a linear modulated signal, when an input power exceeds a fixed value as shown by power input/output characteristics of FIG. 19A, exhibits a nonlinear distortion range as shown by a characteristic A. A frequency spectrum of this distortion range in the vicinity of a transmission frequency $f_0$ in the power amplifier causes side lobes to rise as shown by a characteristic D of FIG. 19B, and leak to an adjacent channel, resulting in an adjacent interference.

Accordingly, in order to obtain a linear characteristic B shown in FIG. 19A, it is necessary to preliminarily provide a characteristic C and to obtain a characteristic E after the compensation of a distortion as shown in FIG. 19B.

2. Description of the Related Art

Thus, as an example of a distortion compensating method for obtaining a desired linear signal in which a distortion is removed from the output of an amplifier by preliminarily adding a characteristic opposite to a distortion characteristic of the amplifier to an input signal of the amplifier, an adaptive predistorter (predistortion) type compensating apparatus as shown in FIG. 20 is generally known.

In FIG. 20, a power amplifier 1 amplifies a transmission signal (hereinafter, occasionally referred to as a reference signal) $S_T$ to provide an output signal $S_O$, which is sent to a subtractor 2 as a feedback signal $S_F$ together with the transmission signal $S_T$. The difference between both signals inputted at the subtractor 2 is sent to an adaptive distortion compensating coefficient (DCC) generator 3.

Then, the adaptive distortion compensating coefficient generator 3 generates a distortion compensating coefficient "h" based on the output of the subtractor 2 as well as the power or the amplitude of the then transmission signal $S_T$, and multiplies the transmission signal $S_T$ by the distortion compensating coefficient h at a multiplier 4, thereby generating a predistorter signal. By inputting this predistorter signal to the power amplifier 1, the output distortion of the power amplifier 1 is compensated.

FIG. 21 shows details of the adaptive predistorter type distortion compensating apparatus as a prior art example (1) (basic arrangement).

In this prior art example (1), the adaptive distortion compensating coefficient generator 3 in the distortion compensating apparatus conceptually shown in FIG. 20 is composed of an inverter 14 for generating a conjugate complex number, multipliers 15–17, an adder 18, an address generator 19, and a distortion compensating table 20. It is to be noted that multipliers 4, 15, and 16 are complex multipliers.

Also, a modulator MOD, which is not shown in FIG. 20, is connected between the power amplifier 1 and the multiplier 4. The modulator MOD is composed of an LPF (low-pass filter) 5, a D/A (digital/analog) converter 6, a local oscillator 7, and a multiplier 8, where a baseband predistorter signal from the multiplier 4 through the LPF 5 is converted into an IF (intermediate frequency) signal.

Also, a digital orthogonal demodulator DEM is provided between the power amplifier 1 and the subtractor 2. This demodulator DEM is composed of an A/D converter 9, a local oscillator 11, a complex multiplier 12, and an LPF 13, where an IF feedback signal $S_F$ is converted into a baseband signal $S_{FB}$ to be provided to the subtractor 2.

FIG. 22 shows an arrangement of the digital orthogonal demodulator DEM shown in FIG. 21. The multiplier 12 is composed of complex multipliers 121 and 122, respectively converting an IF feedback signal ① from the A/D converter 9 into signals ② with cos ωt and sin ωt signals from the local oscillator 11.

Since the signals ② include a high frequency component, signals ③ only of the baseband are outputted respectively from LPF's 131 and 132, so that Ich and Qch components of the feedback signal $S_{FB}$ are respectively provided to the subtractor 2.

A distortion amount to be compensated in FIG. 21 is estimated by calculations of the following equations.

$$h_n(p)=h_{n-1}(p)+\mu e(t)u^*(t) \quad \text{Eq.(1)}$$

$$e(t)=x(t)-y(t) \quad \text{Eq.(2)}$$

$$u(t)=x(t)f(p)\cong h^*_{n-1}(p)y_1(t) \quad \text{Eq.(3)}$$

$$h_{n-1}(p)h^*_{n-1}(p)\cong 1 \quad \text{Eq.(4)}$$

$$y(t)=h_{n-1}(p)x(t)f(p) \quad \text{Eq.(5)}$$

$$p=|x^2(t)| \quad \text{Eq.(6)}$$

In the above equations, x(t) is an input baseband signal, f(p) is a distortion function of the power amplifier 1 itself, $h_n(p)$ is a distortion compensating coefficient to be updated, and $\mu$ is a step size parameter. Furthermore, in the above equations, x, y, f, h, u, and e are complex numbers, and * indicates a conjugate complex number. Also, u(t) is approximated as given in Eq.(4) on the assumption that the amplitude distortion of the power amplifier 1 is not very large.

The meanings of the above equations in the above-mentioned condition will now be described.

In Eq.(1), $h_n(p)$ is an estimated distortion compensating coefficient to be updated, and is inputted to the table 20 which stores the distortion compensating coefficients. From an output y(t) of the power amplifier 1, y*(t) is obtained by the inverter 14 which is a conjugate complex number generation circuit. Accordingly, supposing that the estimated distortion compensating coefficient at the last sampling is $h_{n-1}(p)$, the output of the multiplier 15 assumes y*(t)$h_{n-1}$(p).

The output of the multiplier 15 is further multiplied by an output e(t) of the subtractor 2 at the multiplier 16 to assume y*(t) $h_{n-1}$(p)e(t). Furthermore, it is multiplied by a step size parameter $\mu$ at the multiplier 17.

Accordingly, the estimated distortion compensating coefficient to be updated assumes $h_n(p)=\mu y^*(t)h_{n-1}(p)e(t)+h_{n-1}(p)$.

Supposing that y*(t)$h_{n-1}$(p)=u*(t), the distortion compensating coefficient $h_n$(p) can be expressed as the above-mentioned Eq.(1).

Also, e(t) is the output of the subtractor 2 as expressed by Eq.(2), and is an error between the input x(t) and the output y(t). Furthermore, u(t) in Eq.(3) is approximated as expressed by Eq.(4) on the assumption that the amplitude distortion of the power amplifier 1 is not very large. Accordingly, the conjugate complex number u(t) of u*(t) is expressed as Eq.(3).

Eq.(6) means that the address generator 19 is a circuit for determining the power of the input signal x(t). When it is supposed to be a circuit for determining the amplitude of the input, Eq.(6) is expressed by |x(t)|. Alternatively, when it is supposed to be a function of the power or the amplitude, Eq.(6) is expressed by $g(|x(t)|^2)$ and $g(|x(t)|)$, respectively.

Furthermore, the value determined by the address generator 19 assumes a write/read address for the table 20 storing the distortion compensating coefficient $h_n(p)$.

In case where a write update and a multiplication of the estimated distortion compensating coefficient $h_n(p)$ with the input signal x(t) are independently performed, predistortion is always enabled without an influence of a delay on the system.

Thus, in the above-mentioned prior art example (1), the distortion compensating coefficient $h_n(p)$ is generated referring to the distortion compensating table, and is multiplied by the transmission signal $S_T$, thereby preliminarily generating the predistorter signal. Thus, the characteristic of the power amplifier 1 is corrected to the characteristic B by the signal having the characteristic C as shown in FIG. 19A.

On the other hand, as another arrangement for enhancing the speed of the D/A converter in the modulator by separately handling a main signal (transmission signal) and a compensating signal (distortion compensating component of power amplifier), and for effectively utilizing a dynamic range, a prior art example (2) called a compensating signal separation system as shown in FIG. 23 has already been proposed.

This prior art example (2) is different from the prior art example (1), as shown in FIG. 23, in that while the transmission signal is provided to an adder 63 as a main signal through an LPF 51 and a D/A converter 61, the transmission signal is provided to the adder 63 as a compensating signal through a multiplier 72, the LPF 51, and a D/A converter 62, whereby the output from the adder 63 is provided to the multiplier 8 as the predistorter signal.

Also, the prior art example (2) is different from the prior art example (1) in that an adder 71 for subtracting a coefficient 1+j0 from the distortion compensating coefficient $h_n(p)$ outputted from the distortion compensating table 20 is provided between the distortion compensating table 20 and a multiplier 70 in order to subtract the transmission signal itself.

In the above-mentioned prior art example (1), a phase difference between the transmission signal and the feedback signal is generated in the range of 0–360° at random. Supposing that there is no distortion in the power amplifier 1 and that the phases of the transmission signal and the feedback signal coincide with each other, the distortion compensating coefficient $h_n(p)$ always provides 1+j0 when a distortion compensating operation (distortion compensating coefficient generation) is started, and the then predistorter signal can be expressed by the following equation.

Transmission signal×distortion compensating coefficient=(TxIch+ jTxQch)(1+j0)=TxIch+jTxQch                Eq.(7)

Also, when the phase difference between the transmission signal and the feedback signal is 180° (opposite phase) under the distortion compensating operation being not performed, the distortion compensating coefficient after the distortion compensating operation assumes −1+j0. Therefore, the predistorter signal at this time can be expressed by the following equation.

Transmission signal×distortion compensating coefficient=(TxIch+ jTxQch)(−1+j0)=−TxIch−jTxQch            Eq.(8)

Thus, the distortion compensating operation is performed, and the distortion compensating coefficient $h_n(p)$ after a convergence is expressed by a vector as shown in FIG. 24.

Supposing that an initial value of the distortion compensating coefficient $h_n(p)$ is 1+j0 as shown in FIG. 24, the difference between the initial value and a desired distortion compensating coefficient after the convergence becomes larger as the phase difference between the transmission signal and the feedback signal becomes larger. Therefore, it has been disadvantageous that the convergence of the distortion compensating coefficient is delayed in the above-mentioned prior art example (1).

Also, when the phase difference between the transmission signal and the feedback signal is 0° in the prior art example (2), the compensating signal component is 0. When the phase difference between the transmission signal and the feedback signal is 180°, the compensating signal assumes, as shown in FIG. 19A and FIG. 24, a signal whose phase is inverted by 180° with respect to the main signal and whose amplitude is twice as much.

FIGS. 25A–25C show a representation or expression range of the main signal and the compensating signal in consideration of an amplitude distortion 6 dB (to be corrected up to twice as much in amplitude). Namely, under the distortion compensating operation being not performed, as the phase difference between the transmission signal and the feedback signal becomes larger, the representation range of the compensating signal becomes larger for the main signal in FIG. 25A, and assumes the maximum range when the phase difference is 180°.

Supposing that an input bit number of the D/A converter 6 in the modulator MOD are 16 bits (−32768–+32767), the representation range of the compensating signal when a phase adjustment between the transmission signal and the feedback signal is not performed exhibits as shown in FIG. 25C, and is twice as wide in range as that in the case of the phase difference=0° (when the phase adjustment is performed) shown in FIG. 25B.

When 16 bits are assigned to the input of the D/A converter 6 in consideration of the signal of the phase difference 180°, the signal in FIG. 25B whose phase difference is 0° has no choice but to be represented by the half (−32768/2–+32767/2=−16384–+16383), 15 bits.

Thus, in either prior art example, the power amplifier used especially for W-CDMA or the like has an original signal to which a sign multiplexing is performed and in which an amplitude variation is large, and which is a broadband signal due to a direct spectrum diffusion modulation. Therefore, high bit accuracy and high-speed conversion rate are required for the D/A converter, and when such a requirement is not satisfied, the distortion compensating characteristic deteriorates.

SUMMARY OF THE INVENTION

It is accordingly an object of the present invention to provide an adaptive predistorter type distortion compensating apparatus for calculating a distortion compensating coefficient by using an adaptive algorithm so as to reduce an error between a reference signal and a feedback signal of a circuit which generates a distortion on a basis of the reference signal, and for compensating the distortion by providing the distortion compensating coefficient to the reference signal, whereby an initial value of the distortion compensating coefficient and the coefficient after a convergence can be always operated in a mutually close state by constantly making a phase of a transmission signal and that of the feedback signal coincide with each other, a convergence time can be shortened, and an effective bit number of a D/A converter can be fully utilized.

In order to achieve the above-mentioned object, a distortion compensating apparatus according to the present invention comprises: a phase adjustment circuit for determining a phase shift value which reduces a phase difference between a reference signal and a feedback signal, and for correcting the phase of the reference signal or the feedback signal by the phase shift value. (claim 1)

Namely, in the present invention, as shown in a basic arrangement of FIG. 1, a phase adjustment circuit 10 for setting a phase shift value ω1 is provided for the local oscillator 11 in the demodulator DEM of the prior art example (1) shown in FIG. 21.

The phase shift value ω1 is for making a phase of a reference signal (transmission signal) $S_T$ and a feedback signal $S_F$ coincide with each other. By this phase shift value ω1, as shown in FIG. 1, the phase of the feedback signal is corrected to be made coincide with the reference signal $S_T$. Then, a calculation of a distortion compensating coefficient is performed. It is to be noted that while the phase of the feedback signal is corrected in the example of FIG. 1, it is also possible to correct the phase of the reference signal $S_T$ similarly, to provide an error signal from a subtractor 2 to a distortion compensating coefficient generator 3, and to determine the distortion compensating coefficient similarly.

The above-mentioned phase adjustment circuit may determine the phase shift value from the distortion compensating coefficient.
(claim 2)

In this case, when a real part of the distortion compensating coefficient is positive and an absolute value of an imaginary part is equal to or less than a predetermined value, it is not particularly necessary to make the phases coincide with each other. Therefore, except that case, the phase shift value may be determined based on a sign of the imaginary part. (claim 3)

Namely, except when a real part of the distortion compensating coefficient is positive and an absolute value of an imaginary part is equal to or less than a predetermined threshold value, a phase shift value for a phase adjustment is determined since the phase difference between the reference signal and the feedback signal is large. Based on this phase shift value, the phase of the reference signal or the feedback signal is corrected, and then the calculation of the distortion compensating coefficient may be performed.

Also, the above-mentioned phase adjustment circuit may determine the phase shift value from a correlation between the reference signal and the feedback signal. (claim 4)

Namely, when the phases of both signals are coincident with each other, a real part of a correlation calculation result takes a maximum value, so that an imaginary part assumes 0. Therefore, when the imaginary part is positive or negative to the contrary, the phase shift value is determined in the same way as the above, and the above-mentioned phase correction and the calculation of the distortion compensating coefficient based on the phase correction are performed.

Also, the above-mentioned phase adjustment circuit may include an up/down counter for adding the sign of the imaginary part, a phase update determination circuit for deciding whether or not a counter value of the up/down counter has reached a fixed value, and a phase counter for updating the phase shift value when the phase update determination circuit decides that the counter value has reached the fixed value. (claim 5)

The above-mentioned phase update determination circuit may change the above-mentioned fixed value according to a phase adjustment stage (progress). (claim 6)

Namely, while it is necessary to perform a phase correction at high speed immediately after the start of the phase adjustment, with the above-mentioned fixed value, i.e. a small time constant, the time constant can be made larger as the phase correction progresses, thereby enabling stability to be increased.

Furthermore, the above-mentioned phase adjustment circuit may determine the phase shift value from the error between the reference signal and the feedback signal. (claim 7)

Namely, since the error between the reference signal and the feedback signal becomes larger as the phases of both signals deviate from each other, an optimal phase shift value is selected from among a plurality of values so that the error signal may become minimum.

Furthermore, the above-mentioned phase adjustment circuit may decide a presence/absence of an update of the distortion compensating coefficient, and may determine the phase shift value based on the above-mentioned distortion compensating coefficient only in presence of the update. Alternatively, the phase shift value may be determined from the correlation or the error between the above-mentioned reference signal and the feedback signal in absence of the update of the distortion compensating coefficient. (claims 8 and 9)

Namely, based on "presence/absence" of an update of the distortion compensating coefficient, the phase adjustment is performed by using the above-mentioned distortion compensating coefficient in the presence of the update of the distortion compensating coefficient, and the phase adjustment is performed by using the correlation value or the error signal of the above-mentioned reference signal and feedback signal in the absence of the update of the distortion compensating coefficient.

Furthermore, the above-mentioned phase adjustment circuit may determine the phase difference between the reference signal and the feedback signal by a quadrant determination of a complex plane at an initial stage of the phase adjustment. (claim 10) Furthermore, the phase difference between the reference signal and the feedback signal may be determined with high accuracy by the quadrant determination of the complex plane and a large/small comparison of a real part and an imaginary part. (claim 11)

Namely, sign bits of the real part and the imaginary part of the reference signal, or those of the feedback signal are compared, and a large/small comparison of the real part and the imaginary part is performed. If the determination result of the comparison is used, it is recognized at which angle range the reference signal phase is located within 360°. If the feedback signal is similarly determined, the phase difference between both signals can be determined. Thus, if the phase of both signals is made coincident with each other by the initial phase difference, it becomes possible to drive the phase difference within a predetermined angle range by a single trial when the phase correction is started.

The distortion compensating apparatus described above can be applied not only to a basic system, as shown in FIG. 1 or FIG. 21, of directly inputting the predistorter signal obtained by multiplying the distortion compensating coefficient by the reference signal to the power amplifier 1 as the distortion generation circuit, but also to a compensation signal separation system shown in FIG. 23, i.e. a system of adding the compensating signal being multiplied by the reference signal to the reference signal to provide the predistorter signal and of inputting the predistorter signal to the distortion generation circuit.

BRIEF DESCRIPTION OF THE DRAWINGS

The above and other objects and advantages of the invention will be apparent upon consideration of the following detailed description, taken in conjunction with the accompanying drawings, in which the reference numbers refer to like parts throughout and in which:

FIGS. 17A–17C are block diagrams more specifically showing the embodiment (4) shown in FIG. 15;

DESCRIPTION OF THE EMBODIMENTS

Embodiment (1)

Figure 2:
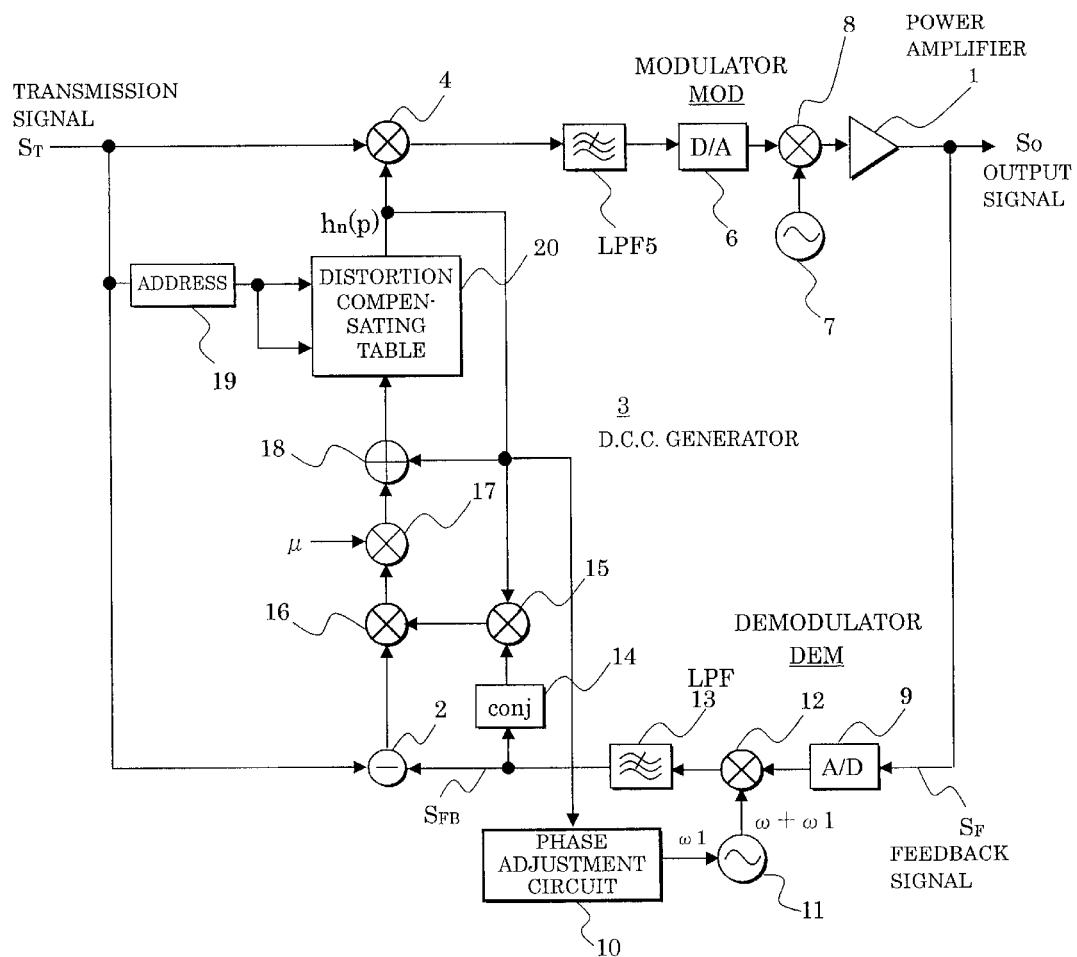
FIG. 2 is a circuit block diagram showing an embodiment (1) of a distortion compensating apparatus according to the present invention.

FIG. 2 shows an embodiment (1) of a distortion compensating apparatus according to the present invention, in which a phase adjustment is performed by a phase adjustment circuit 10 with a distortion compensating coefficient (DCC).

In this embodiment, a phase shift value $\omega 1$ is calculated based on a distortion compensating coefficient $h_n(p)$ obtained from the distortion compensating table 20 in the distortion compensating coefficient generator 3. A phase correction is performed to a feedback signal $S_F$ from the power amplifier 1 based on the phase shift value $\omega 1$. The distortion compensating coefficient $h_n(p)$ is updated by the distortion compensating coefficient generator 3 so that an error, outputted from the subtractor 2, between a feedback signal $S_{FB}$ obtained after the phase correction and a transmission signal (reference signal) $S_T$ may be reduced.

Figure 24:
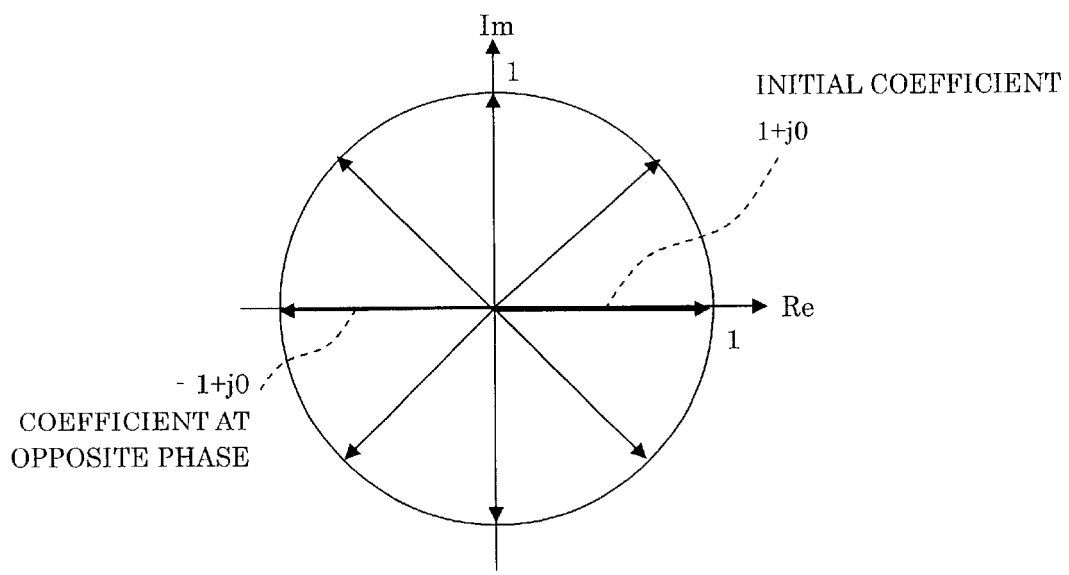
FIG. 24 is a diagram in which a distortion compensating coefficient after a convergence of the prior art example (1) shown in FIG. 21 is indicated by a vector.
Figure 23:
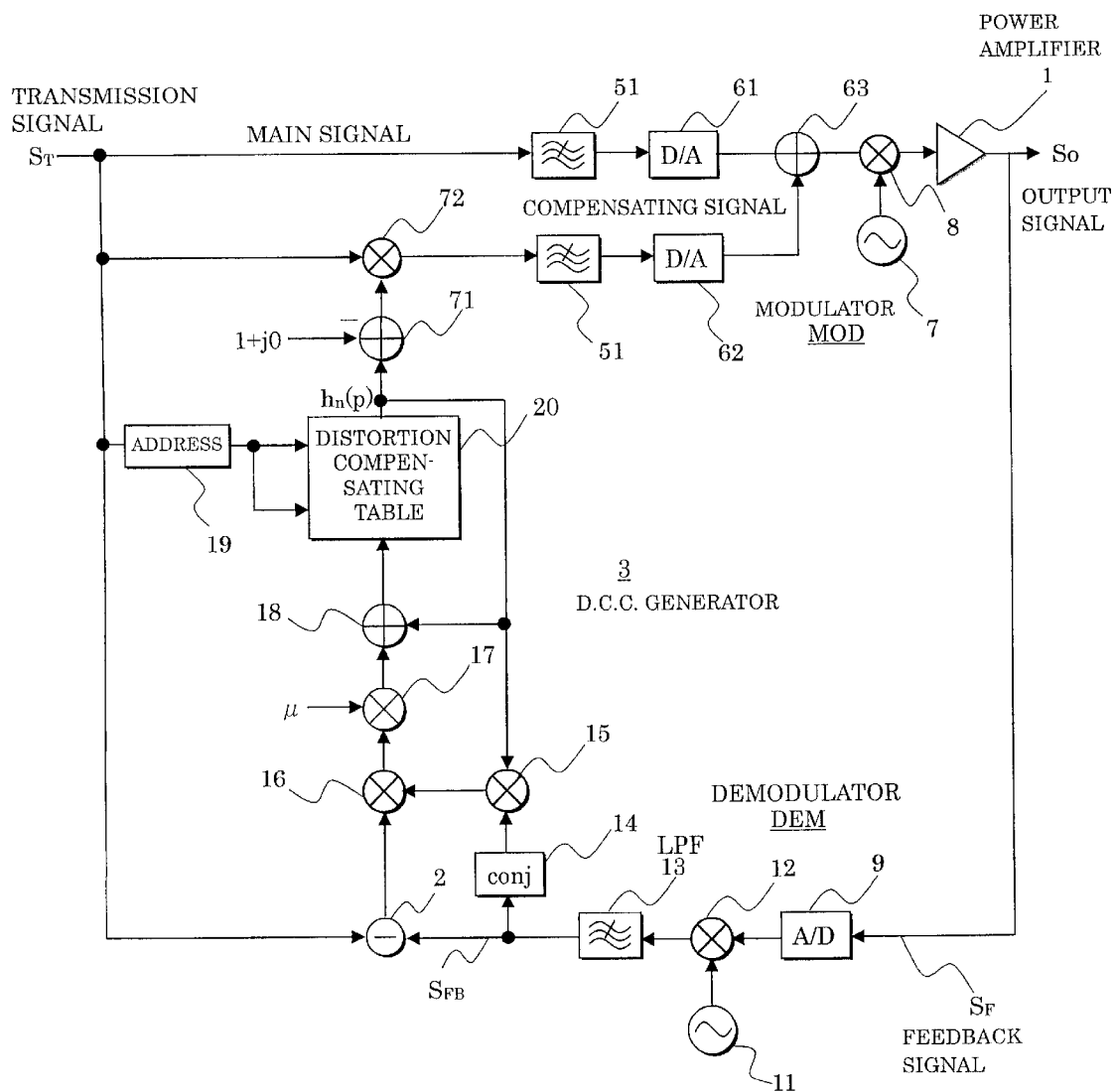
FIG. 23 is a circuit block diagram showing a prior art example (2) (compensating signal separation method) of the adaptive predistorter type distortion compensating apparatus shown in FIG. 20.

This means that when the distortion compensating apparatus starts the operation, the distortion compensating coefficient converges, directs to a certain vector (see FIG. 24), and that a control is performed to direct this vector toward a coefficient $1+j0$.

Figures 3A, 3B:
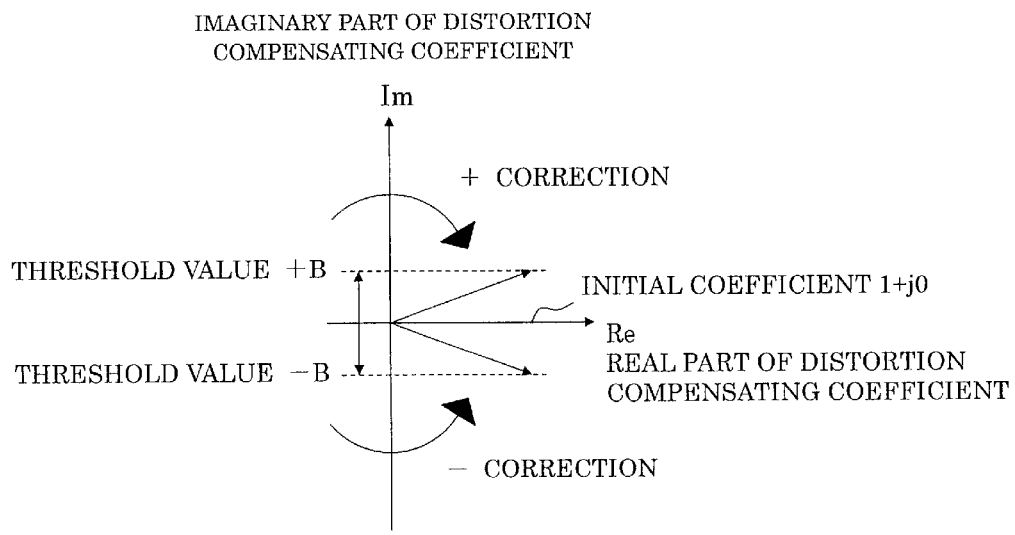
FIGS. 3A and 3B are diagrams showing a control concept in an embodiment (1) of a distortion compensating apparatus according to the present invention.

FIGS. 3A and 3B show a control concept of the embodiment (1). Firstly, as shown in FIG. 3A, when the real part of the distortion compensating coefficient is negative, the phase adjustment is required to be all performed since the phase difference from the initial value $1+j0$ is large.

Also, when the real part of the distortion compensating coefficient is positive and its imaginary part is larger than a threshold value B, the phase adjustment is also required to be performed since the phase difference from the initial value is large. Accordingly, it is adapted that only when the real part of the distortion compensating coefficient is positive and the imaginary part is equal to or less than the threshold value B, the phase correction is not performed.

Namely, the following methods are adopted:
① Check the sign of the real part in the distortion compensating coefficient.→If the sign is negative, the phase is changed;
② Compare the absolute value of the imaginary part in the distortion compensating coefficient with the threshold value.→If the absolute value is larger than the threshold value, the phase is changed;
③ When the phase is changed according to the above-mentioned conditions ① and ②, a phase rotation direction is determined from the sign of the imaginary part.

FIG. 3B shows a table in which phase update information is compiled based on sign bits of such distortion compensating coefficients and a relationship between the imaginary part and the threshold value. Namely, as mentioned above, when the sign of the real part in the distortion compensating coefficient is positive and the imaginary part is positive, and also when the imaginary part is larger than the threshold value B, information for updating the phase in the direction of positive (see FIG. 3A) is generated. When the imaginary part is equal to or less than the threshold value B, the phase update information is not generated.

Also, when the imaginary part is negative, the phase update is performed in the negative direction only when the absolute value of the imaginary part is larger than the threshold value B. When the absolute value is equal to or less than the threshold value B, the phase update is not performed. Furthermore, when the real part of the distortion compensating coefficient is negative, the sign (correction direction) of the phase update information is generated based on the sign of the imaginary part.

Figure 4A:
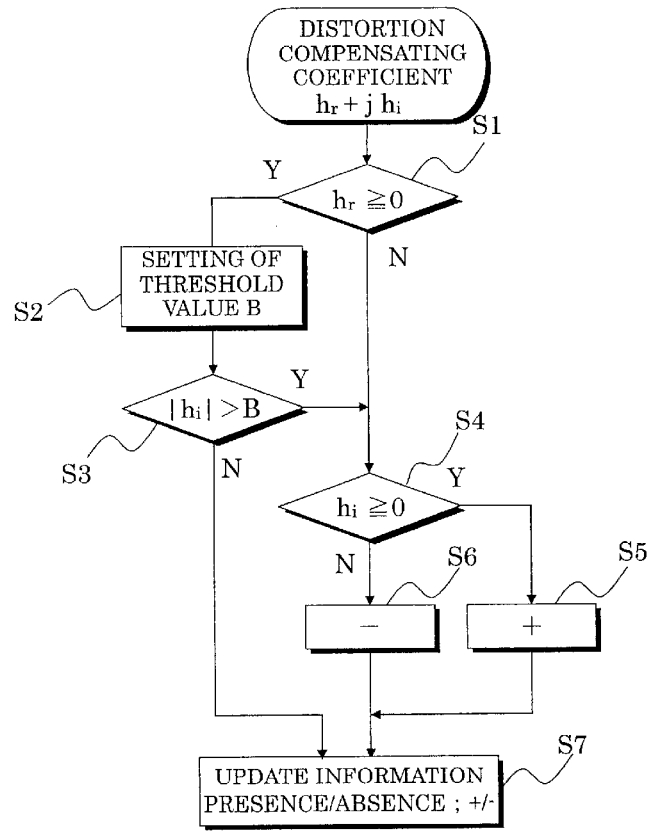
FIGS. 4A and 4B are diagrams showing a phase adjustment circuit example in an embodiment (1) of a distortion compensating apparatus according to the present invention.
Figure 4B:
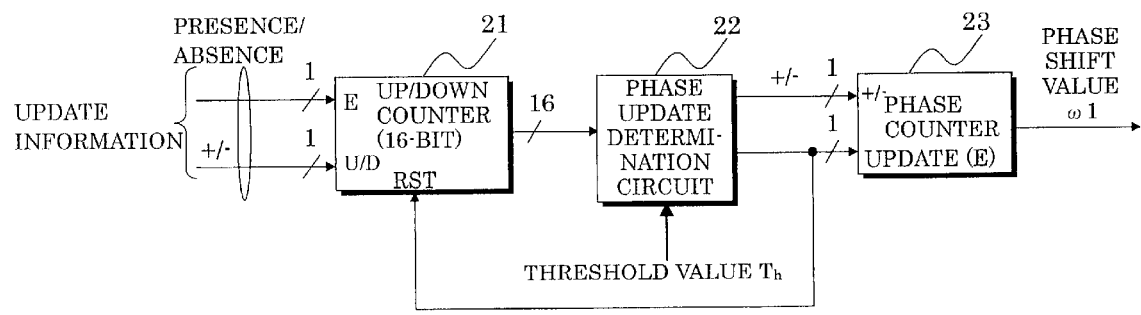

FIGS. 4A and 4B show a system for executing the control concept shown in FIGS. 3A and 3B. FIG. 4A shows a flow chart for generating the phase update information shown in FIGS. 3A and 3B.

Namely, whether or not a real part $h_r$ within the distortion compensating coefficient $h_r+jh_i$ is positive is decided (at step S1). In case $h_r \geq 0$, the threshold value B is set (at step S2), and whether or not the absolute value of the imaginary part $h_i$ is larger than the threshold value B is further decided (at step S3).

As a result, when the imaginary part $h_i$ is equal to or less than the threshold value B, the phase update information is 0 and no phase update is performed. When it is found that the imaginary part is larger than the threshold value B, whether or not the imaginary part hi is positive is decided in the same way as the case where the real part $h_r$ is negative (at step S4).

As a result, when it is found that $h_i \geq 0$, the phase update information is generated in the direction of positive (at step S5), while in case $h_i<0$, the phase update information is generated in the negative direction (at steps S5–S7).

FIG. 4B shows an example of a phase update circuit for performing average processing based on the phase update information generated (at step S7) in FIG. 4A, and for generating the phase shift value ω1.

Namely, this phase update circuit is composed of a 16-bit up/down counter 21, in which a bit indicating the presence/absence of the phase update within the phase update information is made an enable signal, for receiving +/− bit which determines the rotation direction of the phase at an up/down input terminal U/D, a phase update determination circuit 22 for deciding whether or not an output value of the up/down counter 21, i.e. a counter value has exceeded a predetermined threshold value and for outputting phase rotation information (1 bit), and a phase counter 23, in which the phase update determination information (1 bit) is made the enable signal, for counting the phase rotation information +/− outputted from the phase update determination circuit 22. The phase update determination information from the phase update determination circuit 22 to the phase counter 23 forms a reset signal of the up/down counter 21.

In operation, when the update information of FIG. 4A indicates the "absence" of update, the counter 21 performs no operation, and the phase shift value ω1 does not change. When the update information indicates "presence", and the enable signal "1" is provided to a terminal E of the counter 21, the phase rotation information +/− at this time is provided to the U/D input of the counter 21.

Thus, the counter 21 is incremented or decremented in the up or down direction. The output is compared with a threshold value Th in the phase update determination circuit 22. Accordingly, the time until the counter value of the counter 21 exceeds the threshold value Th assumes a time constant, and a control bit is provided to the phase counter 23 in the direction of + or − so that the phase update is performed only when the time constant is exceeded, thereby updating the phase shift value ω1.

Thus, the phase update is not always performed immediately after the phase update information is updated, and the phase shift value ω1 is updated based on the time constant determined by the threshold value Th.

Figure 5:
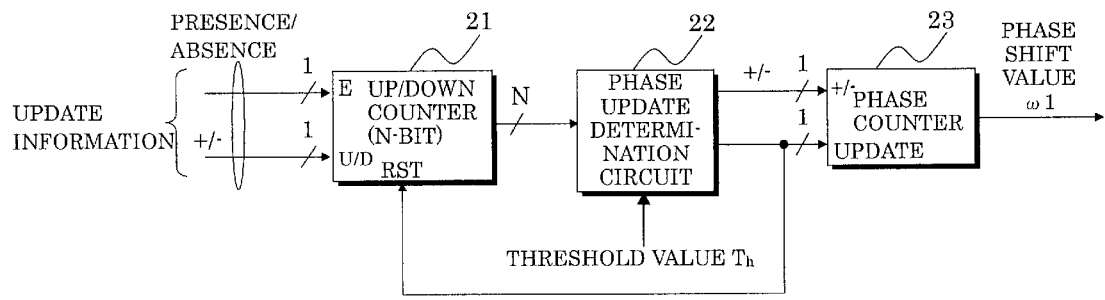
FIG. 5 is a block diagram showing a modification of the phase update circuit example shown in FIG. 4B.

FIG. 5 shows a modification of the phase update circuit shown in FIG. 4B. FIG. 5 is different from FIG. 4B in that the up/down counter 21 uses an N-bit up/down counter instead of the 16-bit counter.

Namely, by changing a counter stage number of the up/down counter 21 at the time of circuit designing, the threshold value Th can be made variable in the phase update determination circuit 22 corresponding to the counter value of the counter 21, thereby enabling various time constants to be provided.

Figure 6:
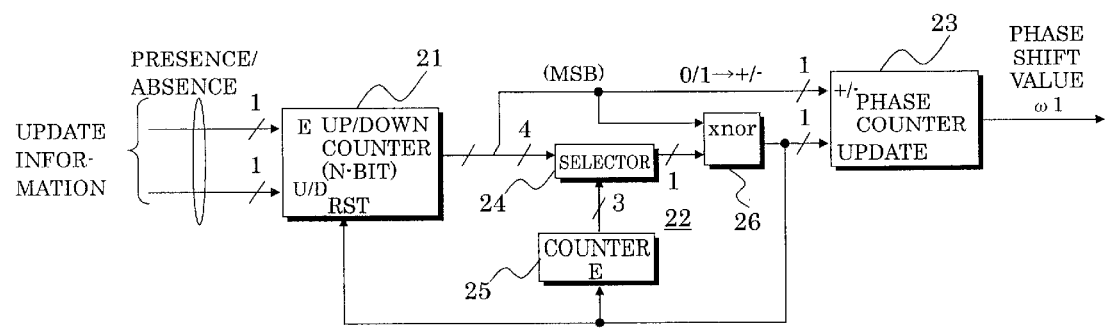
FIG. 6 is a circuit block diagram showing a further modification of the phase update circuit examples shown in FIG. 4B and FIG. 5.

FIG. 6 shows another modification of the phase update circuit shown in FIGS. 4B and 5. In this example, the above-mentioned phase update determination circuit 22 is composed of a selector 24 for inputting upper or significant 4 bits within N bits of the N-bit counter 21, an X-bit counter 25 connected to the selector 24, and an exclusive NOR (ExNOR) circuit 26 for inputting the output of the selector 24 and an MSB bit of the N-bit counter 21 and for outputting the update enable signal (1 bit) to the phase counter 23.

Also, the counter 25 inputs the update enable signal from the circuit 26 to the phase counter 23 to the terminal E simultaneously as the enable signal, and provides the control signal of the upper 3 bits to the selector 24. The MSB bit from the counter 21 forms the phase update bit of the phase counter 23.

Figure 7:
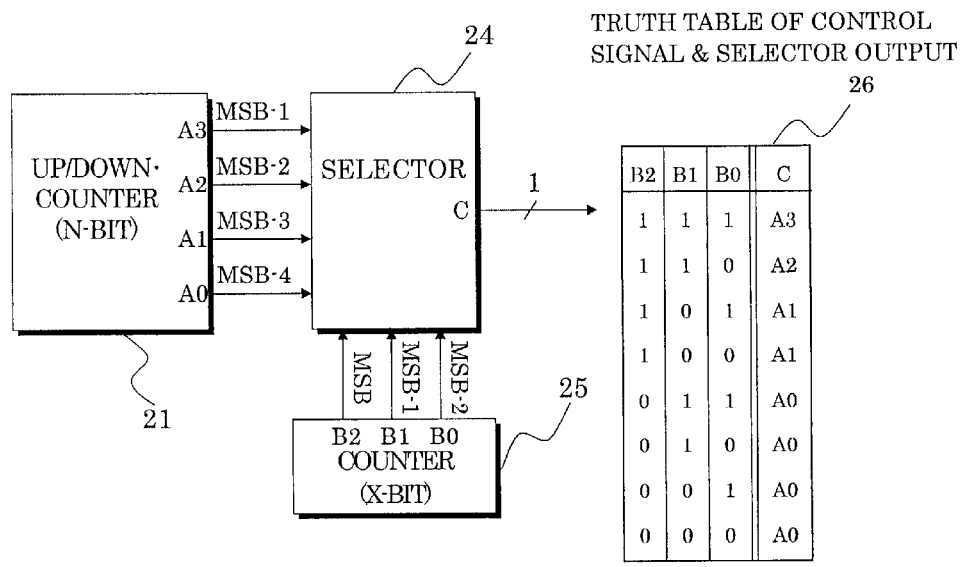
FIG. 7 is a block diagram more specifically showing an arrangement of the phase update circuit shown in FIG. 6.

FIG. 7 shows more specifically a relationship between the counter 21, the selector 24, and the output of both in the phase update circuit shown in FIG. 6. Namely, the upper 4 bits of MSB-1–MSB-4 in the N-bit counter 21 are provided to the selector 24 as a selected signal, and the upper 3 bits of the MSB bit, the MSB-1, and the MSB-2 are provided to the selector 24 from the X-bit counter 25 as a selection control signal. The output signal from an output terminal C of the selector 24 is shown in a truth table 26.

In this arrangement, the phase adjustment is separated into "phase adjustment with high-speed following weighted" and "phase adjustment with stability weighted more than speed" according to the adjustment stage to be used. When the "high-speed phase following" is required, the up/down counter 21 accommodates to it by preliminarily reducing the counter stage number N. In case of the "phase following with stability weighted", the control is performed by preliminarily increasing the counter stage number N.

Thus, in this arrangement, the time constant of the phase adjustment is reduced immediately after the start of the phase adjustment to perform a high-speed phase correction, and the time constant is increased as the phase correction progresses, thereby increasing the stability.

Firstly, if a phase setting is requested, the N-bit counter 21 is reset by the output signal of the circuit 26, and the X-bit counter 25 becomes an enable state.

Since the output signals of 3 bits of the MSB, the MSB-1, and the MSB-2 from the X-bit counter 25 are all "0" initially as shown in the truth table 26, the control signal to the selector 24 is "000" and the MSB-4 bit indicated by an output terminal A0 of the N-bit counter 21 is outputted from the output terminal C.

When the update enable signal is inputted to the counter 23 from the circuit 26, the counter is incremented and the control signal assumes "001". Also in this case, according to the truth table 26, the MSB-4 bit from the A0 output terminal of the N-bit counter 21 is selected and outputted from the output terminal C of the selector 24.

After repeating such an operation, when the control signal assumes "100", the MSB-3 bit from the output terminal A1 of the N-bit counter 21 is new selected by the selector 24 based on the truth table 26 and outputted from the output terminal C.

This means that the counter stage number is increased from the MSB-4 to the MSB-3, and that the time constant in the phase update determination circuit 22 is increased.

1022 are provided to the adder 1025 to obtain the correlation result of the real part, and the multiplication results of the multipliers 1023 and 1024 are provided to the adder 1026 to obtain the correlation result of the imaginary part, which can be expressed by the following equation:

$$\begin{aligned} Tx(t) \times Rx^*(t) &= (TxIch(t) + jTxQch(t))(RxIch(t) + jRxQch(t))^* \\ &\cong (TxIch(t) + jTxQch(t))((TxIch(t) + jTxQch(t))\exp(j\theta))^* \\ &= (TxIch(t) + jTxQch(t))(TxIch(t) - jTxQch(t))\exp(-j\theta) \\ &= (TxIch^2(t) + TxQch^2(t))\exp(-j\theta) \end{aligned} \quad \text{Eq.(9)}$$

$$(\because RxIch(t) + jRxQch(t) \cong (TxIch(t) + jTxQch(t))\exp(j\theta))$$

By repeating such an operation, when the output signal of the X-bit counter 25 assumes "111", the MSB-1 bit from the output terminal A3 of the N-bit counter 21 is selected by the selector 24 and outputted from the output terminal C. At this point, the operation is stopped.

Figure 1:
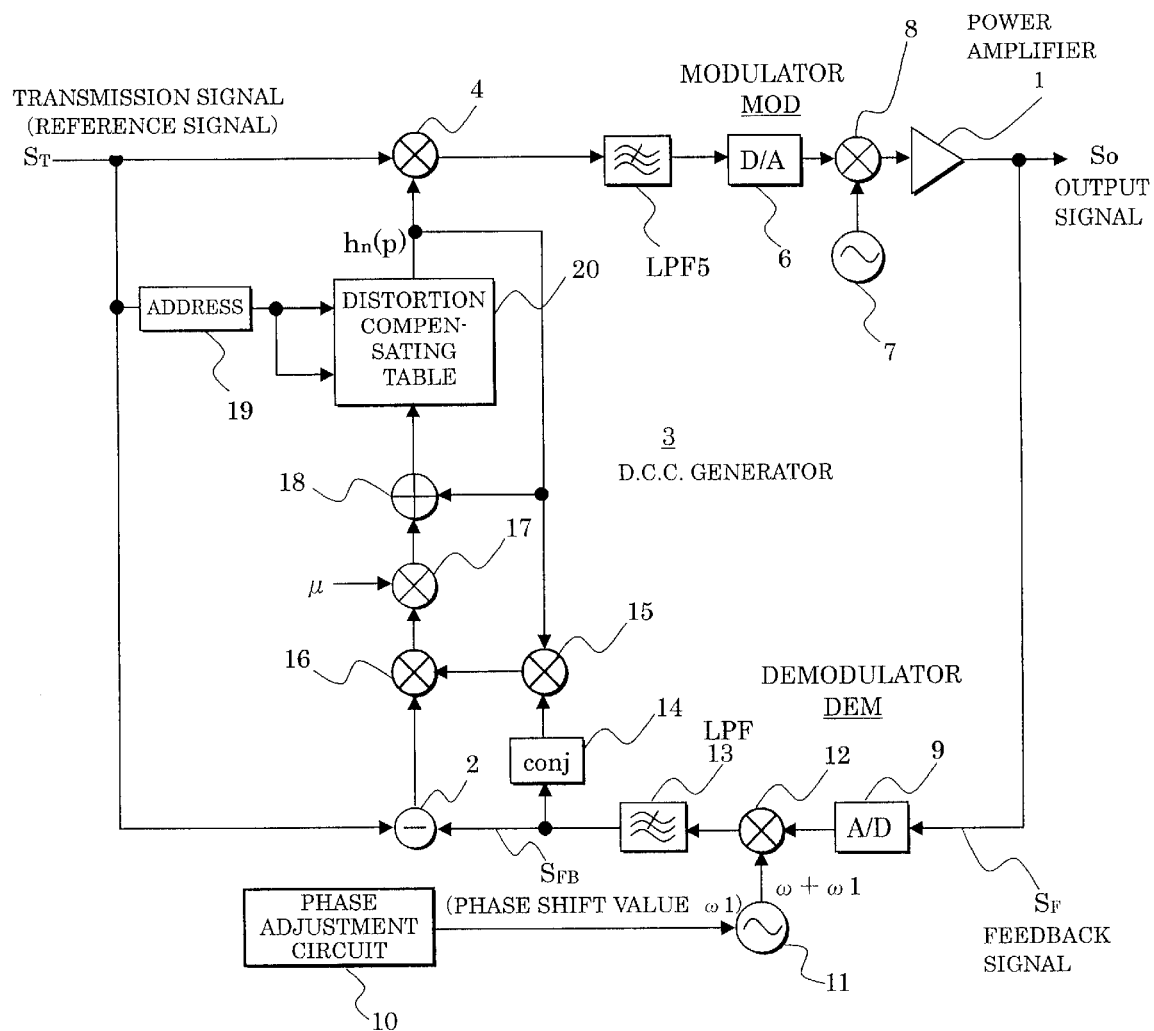
FIG. 1 is a block diagram showing a basic arrangement of a distortion compensating apparatus according to the present invention.
Figure 8:
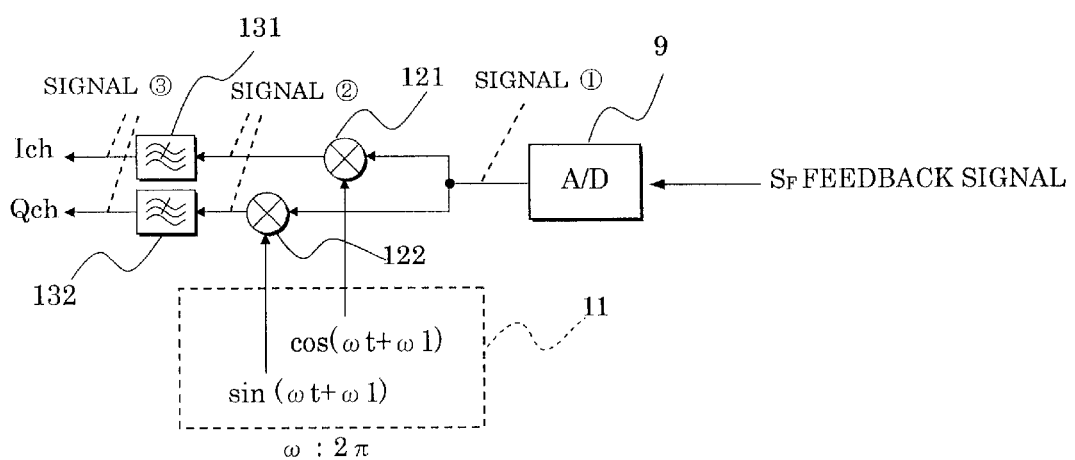
FIG. 8 is a block diagram showing an arrangement of a digital orthogonal demodulator used in the present invention.

FIG. 8 shows an arrangement of the demodulator DEM shown in FIG. 1 and FIG. 2 in this embodiment (1). This arrangement is different form the prior art arrangement shown in FIG. 5 in that signals from the local oscillator 11 to the complex multipliers 121 and 122 are of respectively $\cos(\omega t+\omega 1)$ and $\sin(\omega t+\omega 1)$ including the phase shift value $\omega 1$. Other portions are the same as the prior art arrangement.

Accordingly, by performing a complex multiplication at the multipliers 121 and 122 with the signals from the local oscillator 11 including the phase shift value $\omega 1$, baseband signals ③ including the phase shift value $\omega 1$ are respectively obtained at Ich and Qch and provided to the subtractor 2 as the feedback signal $S_{FB}$.

It is to be noted that the demodulator DEM can be used similarly in the following embodiments.

Embodiment (2)

Figure 9:
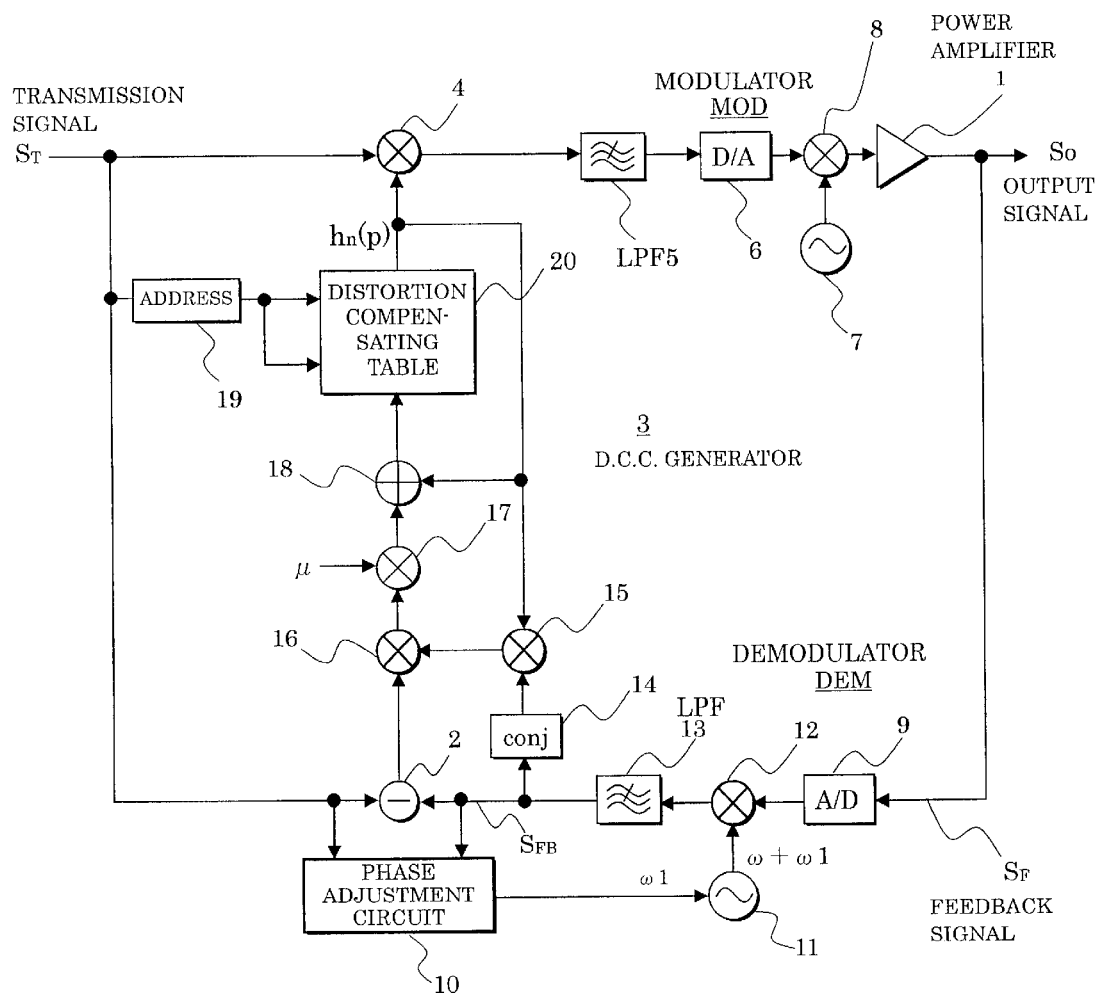
FIG. 9 is a circuit block diagram showing an embodiment (2) of a distortion compensating apparatus according to the present invention.

FIG. 9 shows an embodiment (2) of the distortion compensating apparatus according to the present invention, in which the phase adjustment is performed by the phase adjustment circuit 10 using the transmission signal and the feedback signal.

Namely, as shown in FIG. 9, the phase adjustment circuit 10 adopts a system of receiving the transmission signal $S_T$ and the feedback signal $S_{FB}$ inputted to the subtractor 2, calculating a correlation value of both signals, and obtaining the phase shift value $\omega 1$.

Figure 10A:
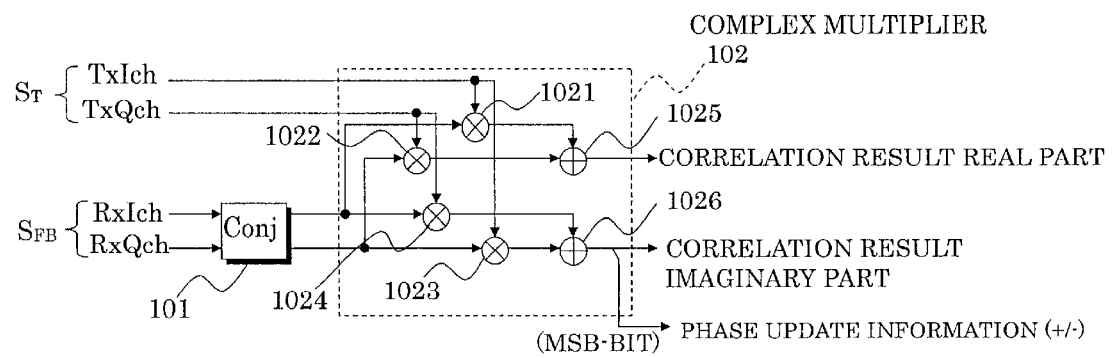
FIGS. 10A and 10B are circuit block diagrams showing a phase adjustment circuit example in an embodiment (2) of a distortion compensating apparatus according to the present invention.
Figure 10B:
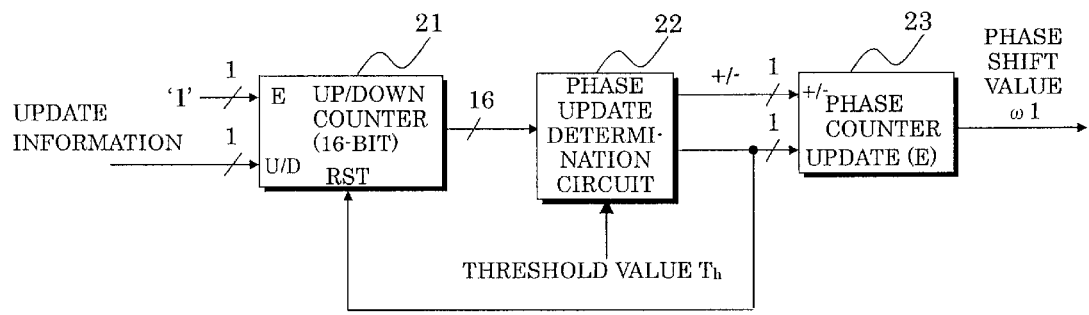

FIGS. 10A and 10B show an example of the phase adjustment circuit in the embodiment (2). Namely, the phase adjustment circuit 10 is composed of a complex multiplier 102 as the phase update information generator shown in FIG. 10A and a phase update circuit shown in FIG. 10B.

The complex multiplier 102 is composed of 4 multipliers 1021–1024 and 2 adders 1025 and 1026, where I channel signals $T_xIch$ and $T_xQch$ in the transmission signal $S_T$ are respectively inputted to the multipliers 1021 and 1022, as well as multipliers 1023 and 1024.

On the other hand, I channel signals $R_xIch$ and $R_xQch$ of the feedback signal $S_{FB}$ are provided to an inverter 101, converted into a conjugate complex number, and provided to the multipliers 1021, 1022, 1023, and 1024 in the same way as the transmission signal $S_T$.

Then, the multiplication results of the transmission signal $S_T$ and the feedback signal $S_{FB}$ at the multipliers 1021 and The phase shift value $\omega 1$ is updated in the same way as the above-mentioned embodiment (1) by using the phase update information +/− of the correlation result (MSB bit) of the imaginary part.

FIG. 10B shows an example of the phase update circuit in this case. This circuit example is different from that shown in FIG. 4B in that the enable input terminal E of the 16-bit up/down counter 21 is always fixed to "1". Namely, when the phase update control is performed by the update information of the imaginary part, the counter 21 is always operated.

It can be seen from the above Eq.(9) that when the phases of the transmission signal $S_T$ and the feedback signal $S_{FB}$ are coincident with each other (θ=0 in the above Eq.(9)), the real part of the correlation value calculated assumes the maximum value, and the imaginary part assumes "0". Accordingly, when the phases of the both signals mutually deviate, the sign bit of the imaginary part should always become positive or negative. The sign bit is accumulated at the counter 21, and decided with the threshold value Th in the same way as the above operation at the phase update determination circuit 22. Then, only as for the sign bit exceeding the threshold value Th, the phase counter 23 is incremented, and the phase shift value $\omega 1$ is updated.

Figure 11:
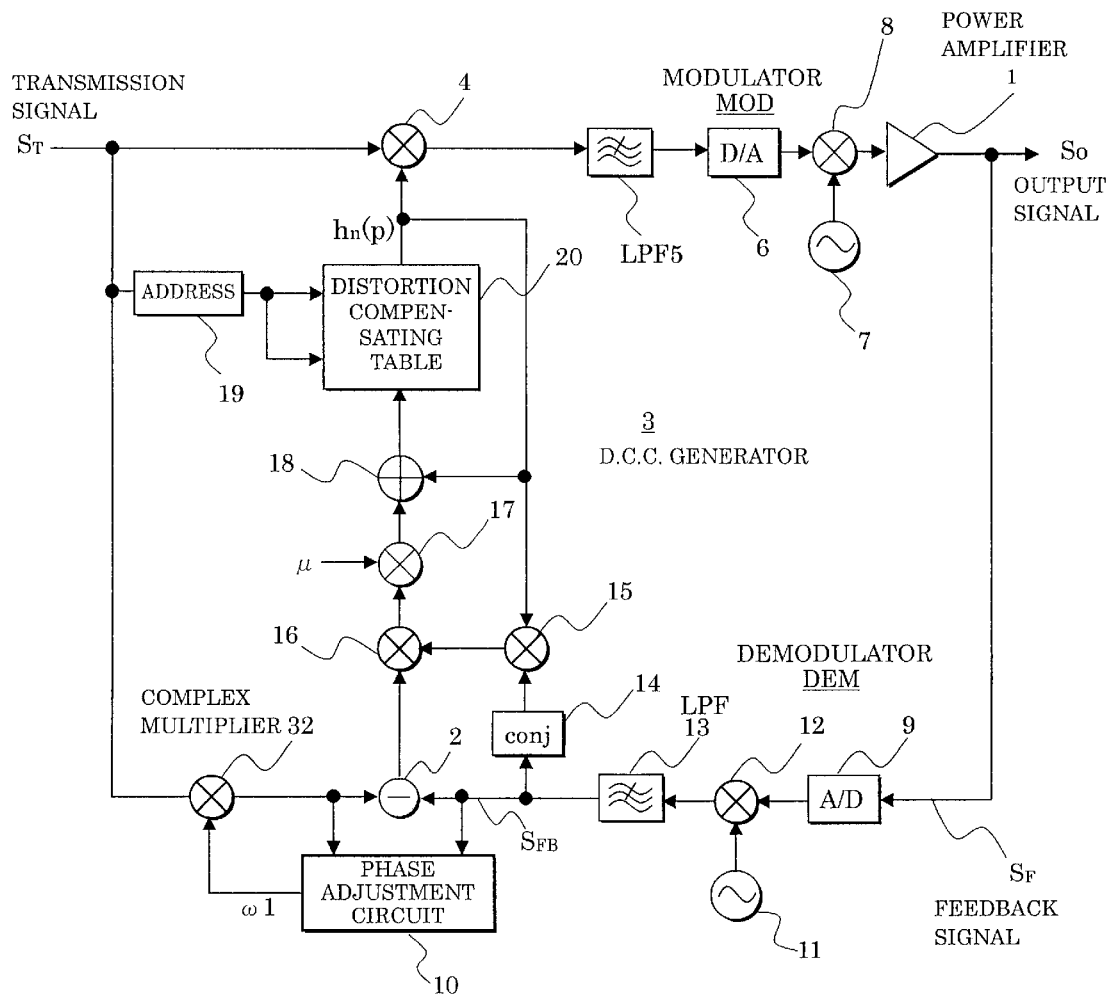
FIG. 11 is a circuit block diagram showing a modification of an embodiment (2) of a distortion compensating apparatus according to the present invention.

FIG. 11 shows a modification of the above-mentioned embodiment (2), which is different from the phase adjustment circuit 10 with the above-mentioned correlation calculation in that the phase difference between both signals determined at the phase adjustment circuit 10 is corrected not by the feedback signal $S_{FB}$ but by the phase rotation of the transmission signal $S_T$. Thus, the phase shift value $\omega 1$ obtained from the phase adjustment circuit 10 is directly provided to a complex multiplier 32, whereby the transmission signal $S_T$ whose phase is rotated is provided to the subtractor 2.

It is to be noted that providing the complex multiplier 32 in this way on the transmission signal side is commonly applied not only to this embodiment but also to all of the embodiments of the present invention.

Also, the complex multiplier 32 may be inserted into the former stage or the latter stage of a filter 5, not on the input side of the subtractor 2. This is also applied to all of the embodiments.

Embodiment (3)

Figure 12:
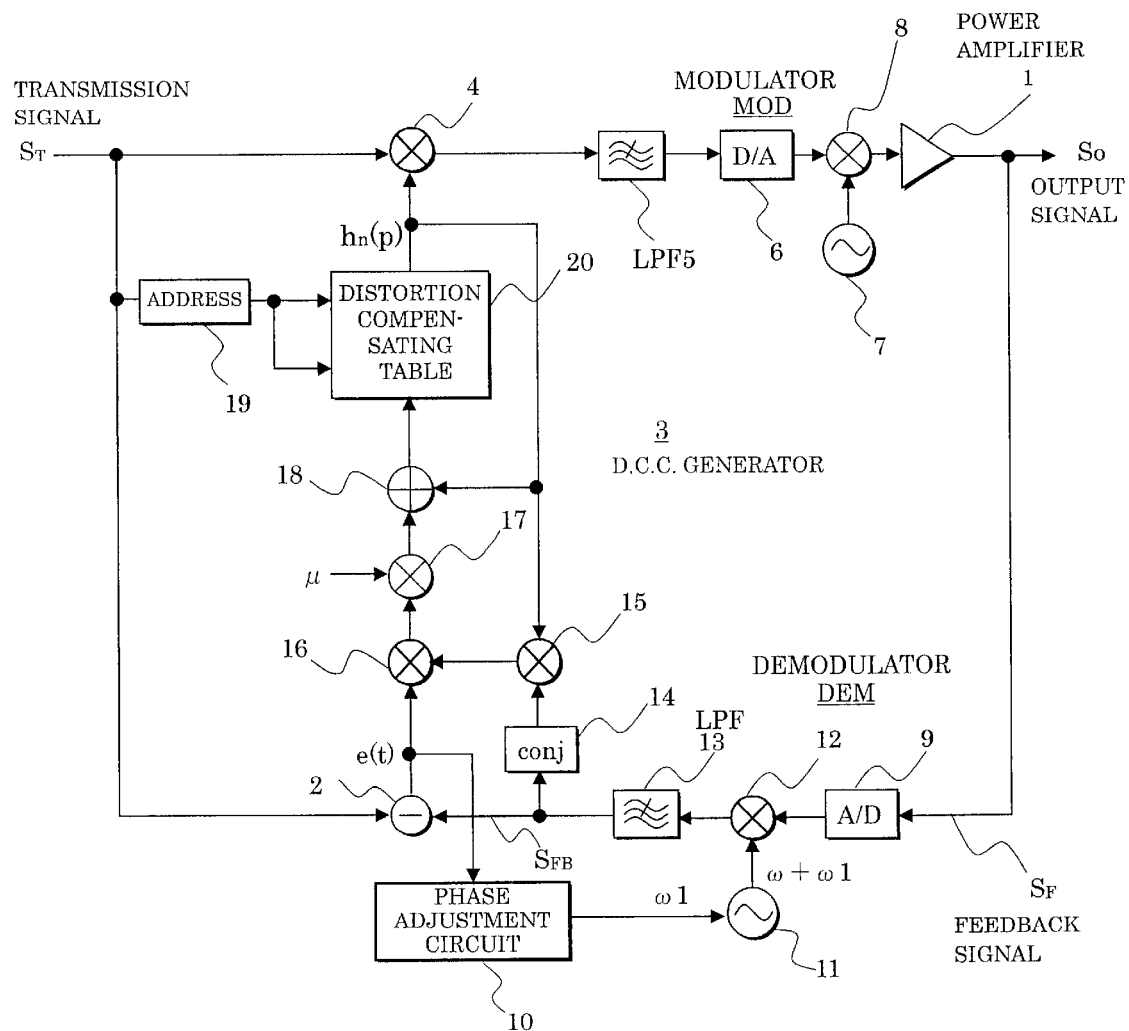
FIG. 12 is a circuit block diagram showing an embodiment (3) of a distortion compensating apparatus according to the present invention.

FIG. 12 shows an embodiment (3) of the distortion compensating apparatus according to the present invention, in which the phase adjustment circuit 10 for determining the phase shift value $\omega 1$ by using an error signal e(t) outputted from the subtractor 2 is used.

Namely, it is noted that the error signal e(t) from the subtractor 2 becomes larger as the phases of the transmission signal $S_T$ and the feedback signal $S_{FB}$ mutually deviate, and the phase shift value ω1 is determined with the point in which the error signal e(t) becomes minimum as an optimum phase value.

Figure 13:
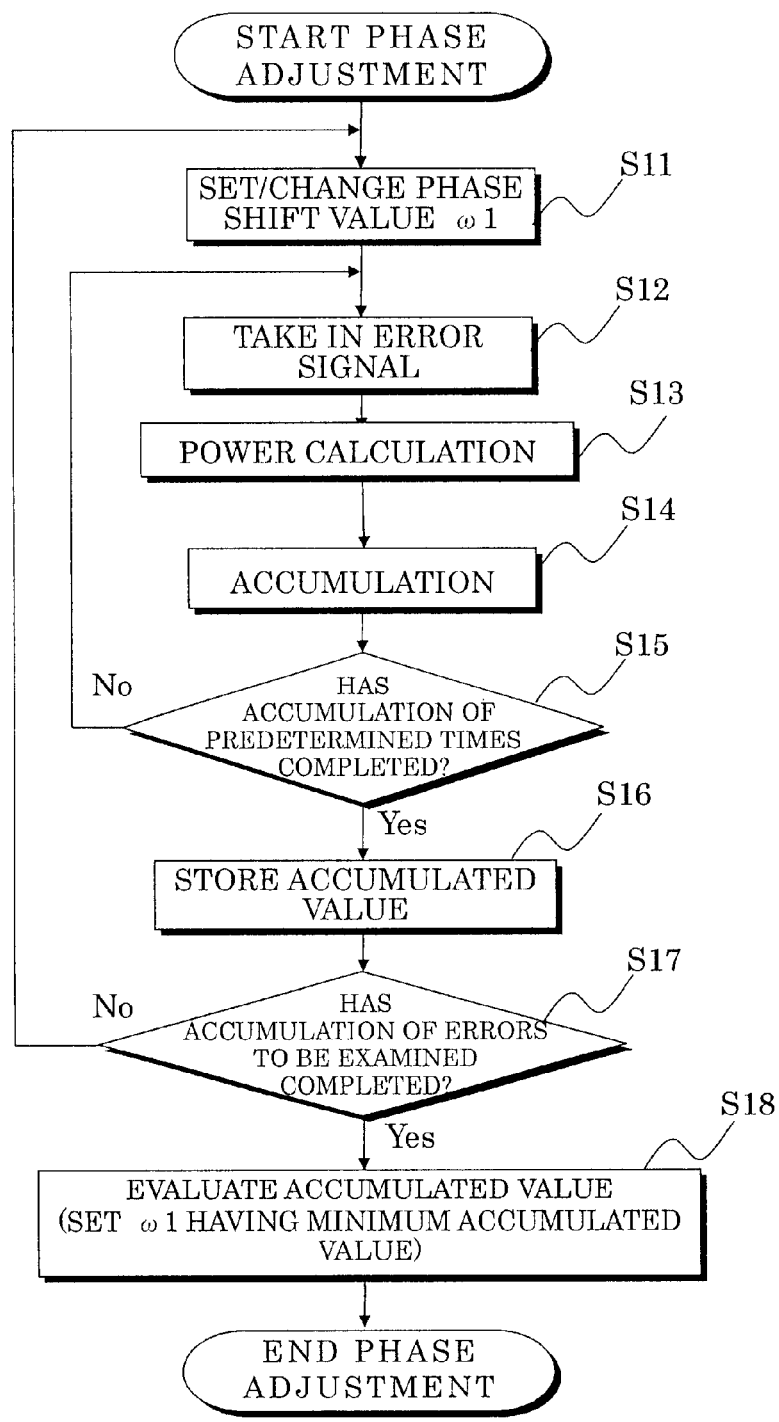
FIG. 13 is a flow chart showing an operation example of a phase adjustment circuit in the embodiment (3) shown in FIG. 12.

FIG. 13 is a flow chart showing an operation of the phase adjustment circuit example in the embodiment (3). In this example, several values to be examined are set as the phase shift value ω1, and accumulation of the error signal e(t) at the time when the phase shift values are set is performed a predetermined times, so that the phase shift value ω1 in which the error signal e(t) becomes minimum is adopted as an optimum phase.

Namely, a certain phase shift value ω1 is firstly initialized from among several possible phase shift values (at step S11). In this state, the error signal e(t) is taken in (at step S12). Then, the power calculation is performed (at step S13), and the accumulation is performed (at step S14). Whether or not the accumulation has been performed a predetermined times is decided (at step S15), and steps S12–S15 are repeated until the accumulation is performed the predetermined times.

After the accumulation is performed the predetermined times, the accumulated value is stored (at step S16). Whether or not all of the accumulation of errors to be examined has been completed is further decided (at step S17). When it has not been completed, the process returns to step S11 to change the phase shift value ω1 to another value to be examined (at step S1). The above-mentioned steps S12–S17 are performed until the accumulation of the errors to be examined has been completed.

After having obtained all of the accumulated values of the errors to be examined, the minimum ω1 among the accumulated values is set as a phase shift value (at step S18).

Switchover Between Embodiments

While the above-mentioned embodiment (1) performs the phase adjustment by using the distortion compensating coefficient, the embodiments (2) and (3) perform the phase adjustment not by using the distortion compensating coefficient. Accordingly, especially in case of the embodiments (2) and (3), whether or not the distortion compensating coefficient is updated greatly influences the control.

Figure 14:
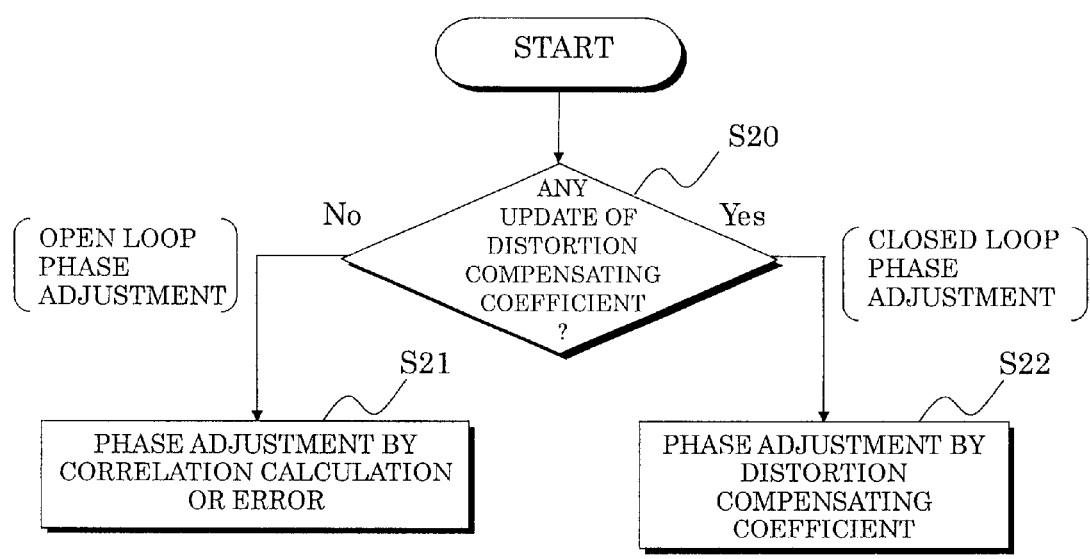
FIG. 14 is a flow chart showing a switchover method of an embodiment of the present invention.

In FIG. 14, according to the presence/absence of the update of such a distortion compensating coefficient, phase adjustment methods, i.e. embodiments are switched over. Namely, assuming that there is an update of the distortion compensating coefficient in case of the embodiment (1) for performing the phase adjustment by using the distortion compensating coefficient (at step S20), the phase adjustment by the distortion compensating coefficient is performed (at step S22).

On the other hand, if the phase adjustment is performed by the correlation calculation or the error in the presence of an update of the distortion compensating coefficient in the embodiment (2) or (3), a state without a convergence of a control may occur. Therefore, in the embodiment (2) or (3), the phase adjustment is performed (at step S21) only in the absence of update of the distortion compensating coefficient at step S20.

Embodiment (4)

Figure 15:
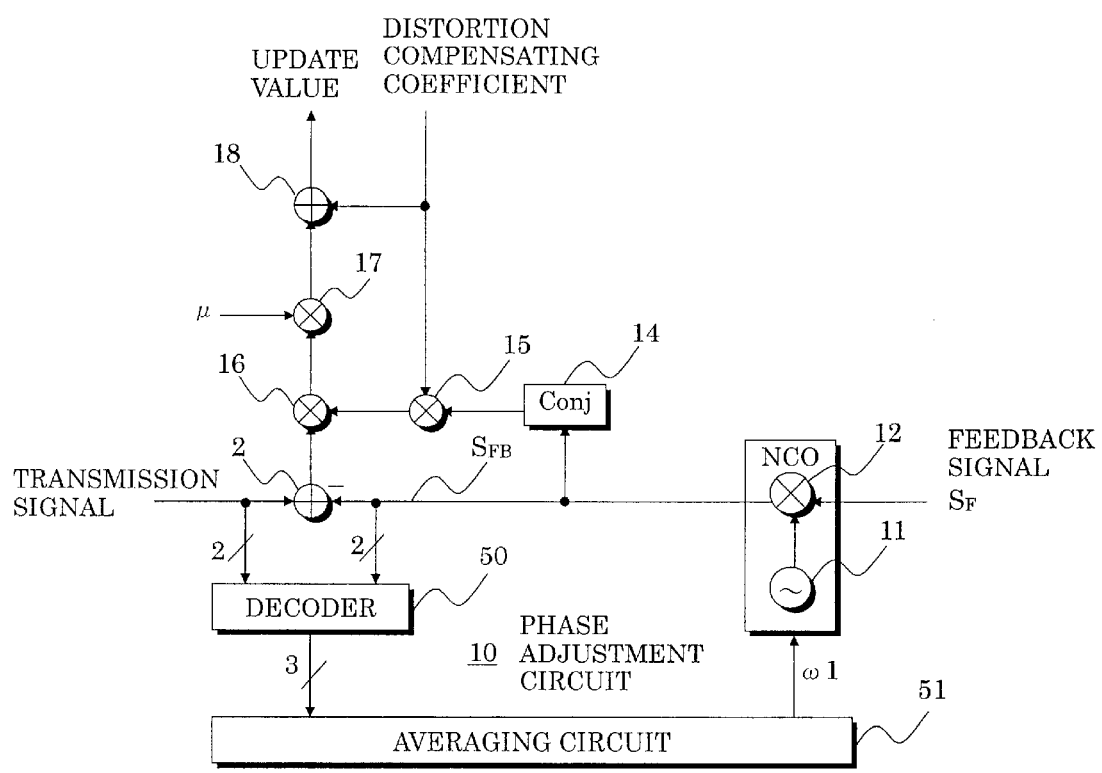
FIG. 15 is a circuit block diagram showing an embodiment (4) of a distortion compensating apparatus according to the present invention.

FIG. 15 shows an embodiment (4) of a distortion compensating apparatus according to the present invention, in which the phase adjustment is performed at a high speed at an initial stage of the phase adjustment. Namely, it is preferable that this embodiment (4) is performed prior to the above-mentioned embodiments (1)–(3).

In this embodiment (4), a decoder 50 as a phase difference detector is provided between the phase adjustment circuit 10 and the subtractor 2. The decoder 50 inputs each signal of I/Q channel of the transmission signal $S_T$ and the feedback signal $S_{FB}$, outputs an initial phase difference between both signals as a 3-bit signal to be provided to an averaging circuit 51.

Namely, when the phase adjustment is started, the phase difference between the transmission signal $S_T$ and the feedback signal $S_{FB}$ mutually deviates in the range of −180°−+180°. In order to drive the phase difference within 45° by a single trial, the decoder 50 generates a 3-bit initial phase difference signal.

For this reason, by using 3 bits, i.e. sign bits (2 bits) in the transmission signal $S_T$ or the feedback signal $S_{FB}$ and a large/small comparison result (1 bit) of the real part (I channel) and the imaginary part (Q channel), it is decided at which part of the range of 45°, which is obtained by dividing 360° into 8 (=$2^3$), the phase of the transmission signal $S_T$ or the feedback signal $S_{FB}$ is located.

Figure 16A:
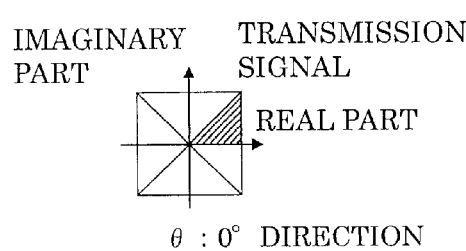
FIGS. 16A–16D are diagrams for illustrating a phase correction operation of the embodiment (4) shown in FIG. 15.
Figure 16B:
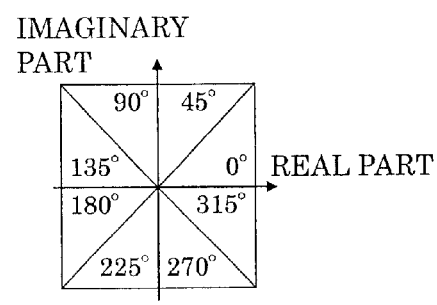

FIGS. 16A and 16B show this state. When the phase of the transmission signal $S_T$ exists in the range of 0–45° shown by hatching, both of the real part and the imaginary part are positive, and the real part has a value larger than that of the imaginary part.

Figure 16C:
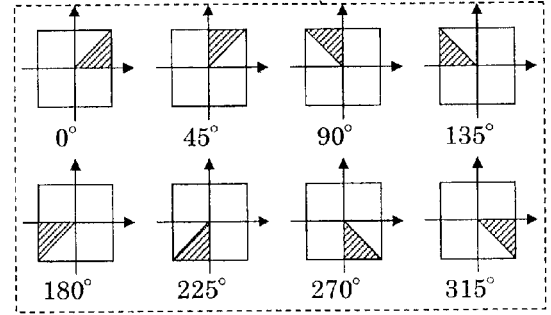
Figure 16D:
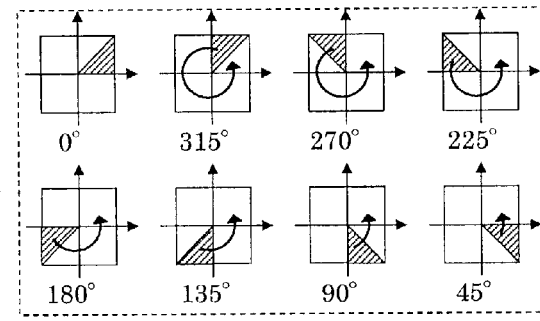

Supposing that the transmission signal $S_T$ indicates a phase θ=0° shown by hatching in FIG. 16A, and the other feedback signal $S_{FB}$ exhibits 8 states of 0°, 45°, 90°, 135°, 180°, 225°, 270°, and 315° shown by hatching in FIG. 16C, it is indicated that a phase correction between both signals as shown in FIG. 16D requires a counterclockwise phase rotation of 0°, 315°, 270°, 225°, 180°, 135°, 90°, and 45°, respectively.

FIGS. 17A and 17B show an arrangement for the case where the decoder 50 decodes the phase difference whose correction shown in FIG. 16A is assumed to be 3 bits. Also, FIG. 17C shows a specific example of FIG. 15.

The phase of the transmission signal or the feedback signal can be determined by the following equation at an accuracy of 45°.

$$\phi = 4 \times sgn(Q) + 2 \times (sgn(I) \oplus sgn(Q)) + (sgn(|I|-|Q|) \oplus (sgn(I) \oplus sgn(Q))) \qquad \text{Eq.(10)}$$

⊕: ExOR

In this Eq.(10), sgn( ) means a sign. When the sign is positive, the calculation is performed with "0", and when the sign is negative, the calculation is performed with "1", so that a phase value φ can be determined as a value of 0–7.

For example, $$\phi = 180° = 4 \times 1 + 2 \times (1 \ ExOR. 1) + (0 \ ExOR(1 \ ExOR 0)$$
$$= 4 + 0 + 0$$
$$= \text{``100''}$$

Similarly, the phase value of the feedback signal can be determined.

FIG. 17B shows an initial phase difference (3 bits) thus obtained by decoding the phase difference of the transmission signal and the feedback signal by the decoder 50.

The phase shift value ω1 can be obtained by passing the thus obtained initial phase difference through the averaging circuit 51.

Figure 18A:
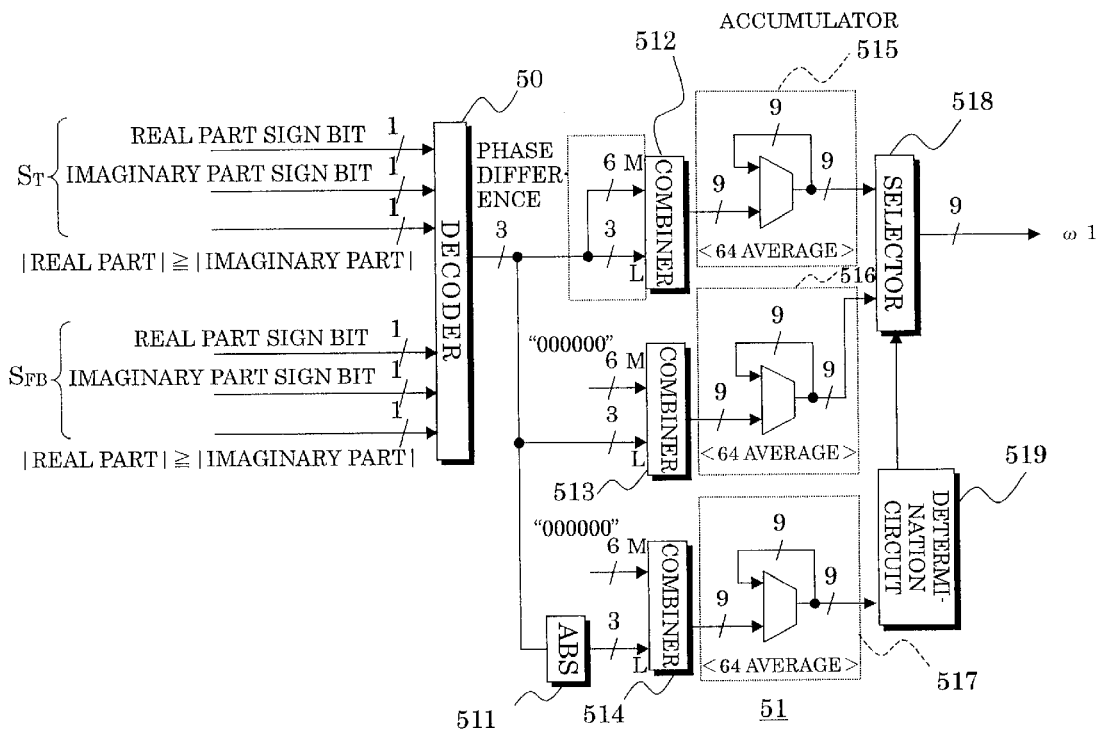
FIGS. 18A and 18B are circuit block diagrams more specifically showing the averaging circuit shown in FIGS. 17A–17C.
Figure 18B:
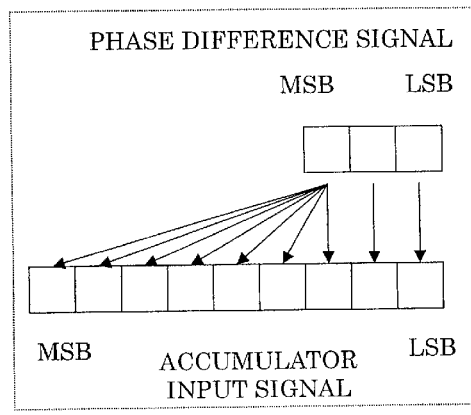
Figure 19A:
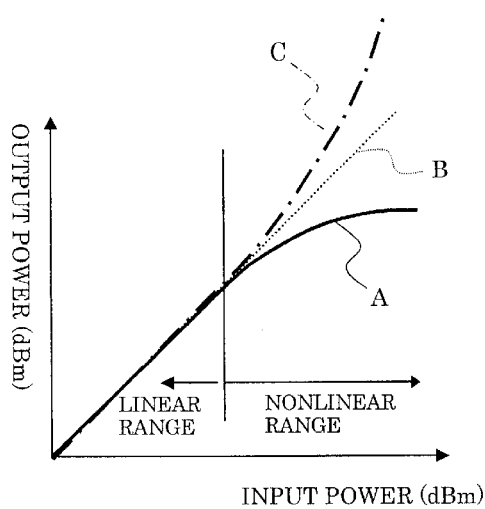
FIGS. 19A and 19B are curve diagrams for showing an input/output characteristic of a power amplifier and a frequency spectrum characteristic.
Figure 19B:
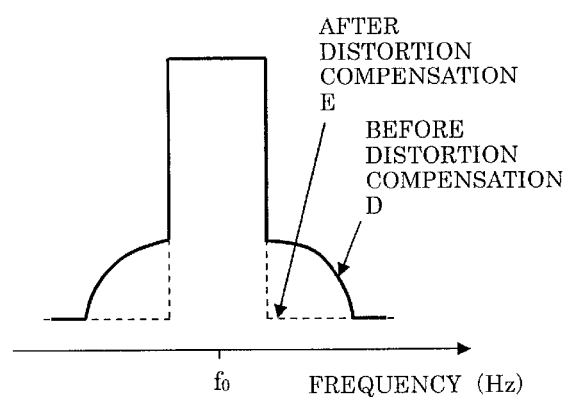
Figure 20:
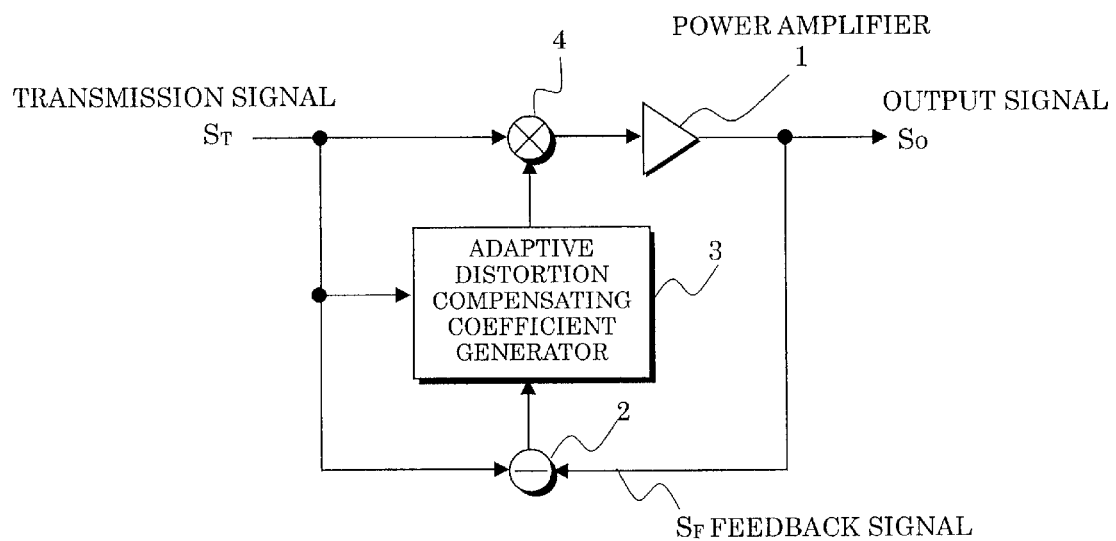
FIG. 20 is a block diagram showing a general arrangement of a prior art adaptive predistorter type distortion compensating apparatus.
Figure 21:
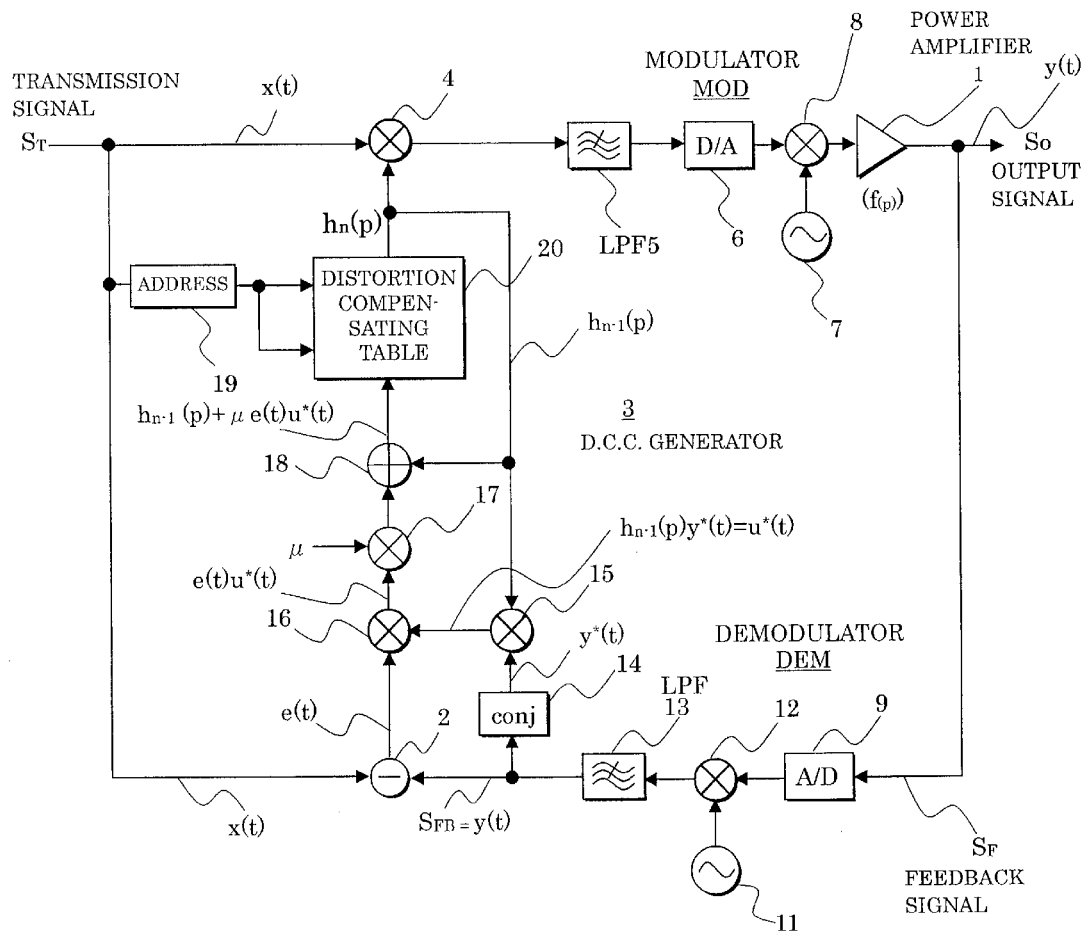
FIG. 21 is a circuit block diagram showing a prior art example (1) of the adaptive predistorter type distortion compensating apparatus shown in FIG. 20.
Figure 22:
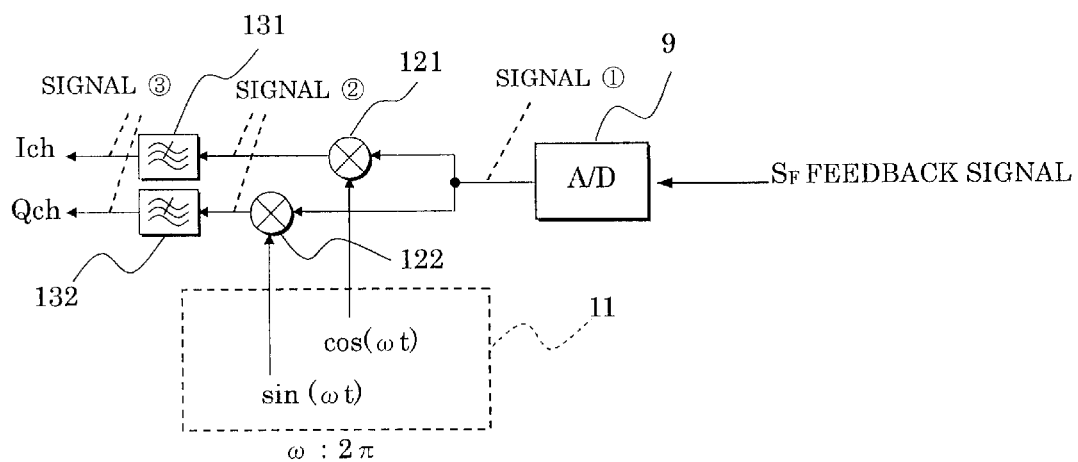
FIG. 22 is a block diagram showing an arrangement of the digital orthogonal demodulator in FIG. 21.

FIGS. 18A and 18B show a specific arrangement of the averaging circuit 51. While the phase difference may be outputted unchanged as a phase shift value ω1 in FIG. 18A, a fixed amount is accumulated to be averaged, thereby obtaining a stable phase shift value ω1.

Namely, the phase difference (3 bits) from the decoder 50 is provided to combiners 512–514. However, in case of the combiner 512, as shown in FIG. 18B, the MSB bit among the phase difference (3 bits) is developed into 6 bits to be made "two's"-complement numbers of 9 bits. Then, it is provided to an accumulator 515, and the average of 64 is determined to be outputted to a selector 518.

Also, in case of the combiner 513, 6 bits "000000" are added to the inputted data to be made an absolute value of 9 bits. Then, it is provided to an accumulator 516 in the same way as the above operation, and the average value of 64 is outputted to the selector 518.

Furthermore, the data provided to the combiner 514 is converted into the "two's"-complement numbers in the form of an absolute value expression at a preceding absolute value circuit (ABS) 518. Furthermore, "000000" is added at the combiner 514, and the average value of 64 is outputted from an accumulator 517 to a determination circuit 519.

The combiner 512 and the accumulator 515 provide an average phase difference between the 1st and the 4th quadrants in FIG. 17B. The combiner 513 and the accumulator 516 provide the average phase difference between the 2nd and the 3rd quadrants in the same manner.

When the MSB bit of the average phase difference obtained by the combiner 514 and the accumulator 517 is "0", the determination circuit 519 controls the selector 518 to select the output of the accumulator 515. When the MSB bit is "1", the determination circuit 519 selects the output of the accumulator 516. Thus, the phase shift value ω1 is obtained.

The reason for adopting such an arrangement is as follows:

When the phase difference data from the decoder 50 continues, for example, "000 (0°)"→"111 (315°)" in FIG. 17B, the average value of both becomes about "100", which corresponds to 180° of FIG. 17A, resulting in an output of a wrong average value.

In order to avoid this, it is necessary to take an average of the data with the "two's"-complement numbers as for the 1st and 4th quadrants. Also, as for the 2nd and 3rd quadrants, if an average is taken with the absolute value instead of the "two's"-complement numbers, an accurate average value can be obtained.

Accordingly, it can be seen that the selection of the output of the accumulators 515 and 516 can be performed if the quadrant of the phase difference data is decided.

On the other hand, the 1st and the 4th quadrants, as shown in FIG. 17A, correspond to the range of −90°–+90°. The 2nd and the 3rd quadrants correspond to the ranges of −90°–180°, and +90°–+180°. Therefore, it can be seen that the absolute value of the 2nd and 3rd quadrants is larger. Accordingly, if the absolute value of the phase difference data is taken and its MSB bit is observed, whether it is in the 1st and the 4th quadrants or the 2nd and 3rd quadrants can be decided.

Based on the MSB bit of the accumulator 517, the determination circuit 519 explicitly separates the phase control in the 1st and the 4th quadrants and the phase control in the 2nd and the 3rd quadrants in FIG. 17B to output the phase shift value ω1 from a selector 578, thereby obtaining an accurate phase correction as shown in FIG. 16D.

As described above, a distortion compensating apparatus according to the present invention is arranged such that a phase adjustment circuit determines a phase shift value which reduces a phase difference between a reference signal and a feedback signal, and corrects the phase of the reference signal or the feedback signal by the phase shift value. Therefore, it is possible to always make the phases of the reference signal and the feedback signal coincident with each other, and to operate in a state in which an initial coefficient and a coefficient after a convergence are always close, thereby enabling a convergence time to be shortened.

Figure 25A:
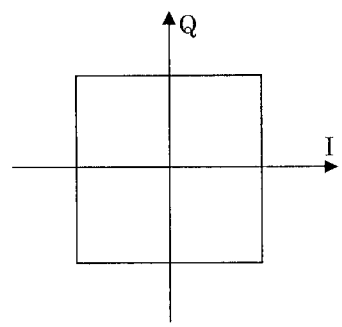
FIGS. 25A–25C are diagrams for illustrating issues of the prior art example (2) shown in FIG. 24.
Figure 25B:
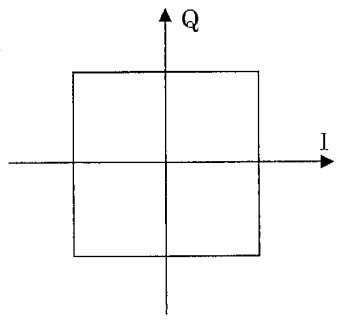
Figure 25C:
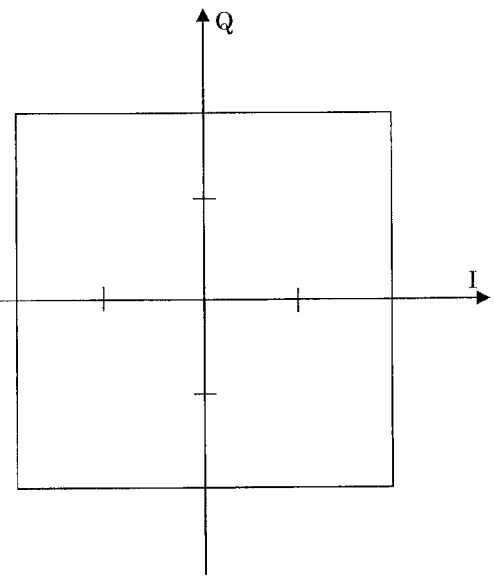

Also, since a phase adjustment is performed and the phase difference is always kept 0°, 16 bits can be assigned to the input of the D/A converter in accordance with the signal shown in FIG. 25B, and the effective bit number of the D/A converter can be fully utilized (dynamic range can be fully utilized).

What we claim is:

1. A distortion compensating apparatus comprising:
   an adaptive predistorter type distortion compensating circuit for calculating a distortion compensating coefficient by using an adaptive algorithm so as to reduce an error between a reference signal and a feedback signal of a circuit which generates a distortion on a basis of the reference signal, and for compensating the distortion by providing the distortion compensating coefficient to the reference signal, and
   a phase adjustment circuit for determining a phase shift value which reduces a phase difference between the reference signal and the feedback signal, and for correcting the phase of one of the reference signal and the feedback signal received by the distortion compensating circuit by the phase shift value.

2. The distortion compensating apparatus as claimed in claim 1 wherein the phase adjustment circuit determines the phase shift value from the distortion compensating coefficient.

3. The distortion compensating apparatus as claimed in claim 2 wherein except when a real part of the distortion compensating coefficient is positive and an absolute value of an imaginary part is equal to or less than a predetermined threshold value, the phase adjustment circuit determines the phase shift value based on a sign of the imaginary part.

4. The distortion compensating apparatus as claimed in claim 1 wherein the phase adjustment circuit determines the phase shift value from a correlation between the reference signal and the feedback signal.

5. The distortion compensating apparatus as claimed in claim 3 wherein the phase adjustment circuit includes an up/down counter for adding the sign of the imaginary part, a phase update determination circuit for deciding whether or not a counter value of the up/down counter has reached a fixed value, and a phase counter for updating the phase shift value when the phase update determination circuit decides that the counter value has reached the fixed value.

6. The distortion compensating apparatus as claimed in claim 5 wherein the phase update determination circuit changes the fixed value according to a phase adjustment stage.

7. The distortion compensating apparatus as claimed in claim 1 wherein the phase adjustment circuit determines the phase shift value from the error between the reference signal and the feedback signal.

8. The distortion compensating apparatus as claimed in claim 2 wherein the phase adjustment circuit decides a presence/absence of an update of the distortion compensating coefficient, and determines the phase shift value in presence of the update.

9. The distortion compensating apparatus as claimed in claim 4 wherein the phase adjustment circuit decides a presence/absence of an update of the distortion compensating coefficient, and determines the phase shift value in absence of the update.

10. The distortion compensating apparatus as claimed in claim 1 wherein the phase adjustment circuit determines the phase difference between the reference signal and the feedback signal by a quadrant determination of a complex plane.

11. The distortion compensating apparatus as claimed in claim 10 wherein the phase adjustment circuit determines the phase difference between the reference signal and the feedback signal by the quadrant determination of the complex plane and a large/small comparison of a real part and an imaginary part.

12. The distortion compensating apparatus as claimed in claim 4 wherein the phase adjustment circuit includes an up/down counter for adding the sign of the imaginary part, a phase update determination circuit for deciding whether or not a counter value of the up/down counter has reached a fixed value, and a phase counter for updating the phase shift value when the phase update determination circuit decides that the counter value has reached the fixed value.

13. The distortion compensating apparatus as claimed in claim 3 wherein the phase adjustment circuit decides a presence/absence of an update of the distortion compensating coefficient, and determines the phase shift value in presence of the update.

14. The distortion compensating apparatus as claimed in claim 5 wherein the phase adjustment circuit decides a presence/absence of an update of the distortion compensating coefficient, and determines the phase shift value in absence of the update.

* * * * *